US008179357B2

(12) United States Patent
Otose

(10) Patent No.: US 8,179,357 B2
(45) Date of Patent: May 15, 2012

(54) SEMICONDUCTOR CIRCUIT, SCANNING CIRCUIT AND DISPLAY DEVICE USING THESE CIRCUITS

(75) Inventor: Tomohiko Otose, Kawasaki (JP)

(73) Assignee: NLT Technologies, Ltd., Kanagawa (JP)

(*) Notice: Subject to any disclaimer, the term of this patent is extended or adjusted under 35 U.S.C. 154(b) by 1188 days.

(21) Appl. No.: 11/987,057

(22) Filed: Nov. 27, 2007

(65) Prior Publication Data

US 2008/0123799 A1 May 29, 2008

(30) Foreign Application Priority Data

Nov. 27, 2006 (JP) ................................ 2006-318634

(51) Int. Cl.
*G09G 3/36* (2006.01)
*G11C 19/00* (2006.01)

(52) U.S. Cl. ............ 345/100; 345/213; 377/64; 377/67; 377/76; 377/78

(58) Field of Classification Search .............. 377/64–81; 345/98, 99, 100, 206, 213
See application file for complete search history.

(56) References Cited

U.S. PATENT DOCUMENTS 5,090,036 A * 2/1992 Hoehn ............................ 377/78
5,949,398 A * 9/1999 Kim .............................. 345/100
6,247,138 B1 * 6/2001 Tamura et al. ................ 713/600
6,831,622 B2 * 12/2004 Aoki .............................. 345/87
6,845,140 B2 1/2005 Moon et al.
7,042,895 B1 * 5/2006 Nguyen et al. ................ 370/442
7,259,740 B2 8/2007 Haga et al.
7,602,361 B2 10/2009 Aoki
7,777,701 B2 * 8/2010 Eom .............................. 345/82
2001/0022573 A1 * 9/2001 Sasaki et al. .................. 345/100
2004/0196248 A1 * 10/2004 Sekine .......................... 345/100
2005/0008114 A1 * 1/2005 Moon ............................ 377/64
2005/0162448 A1 * 7/2005 Aoki ............................ 345/690

(Continued)

FOREIGN PATENT DOCUMENTS

JP 10-31202 2/1998

(Continued)

OTHER PUBLICATIONS

David J. Comer, Donald T. Comer, "Fundamentals of Electronic Circuit Design," May 21, 2002, Wiley, ISBN 0471410160, p. 285.*

(Continued)

*Primary Examiner* — Alexander Eisen
*Assistant Examiner* — Sanjiv D Patel
(74) *Attorney, Agent, or Firm* — Young & Thompson

(57) ABSTRACT

In a semiconductor circuit a floating node is set to any voltage by utilizing a control signal applied to a refresh terminal and has a period shorter than that of a clock signal. The circuit includes first and second transistors connected between a first clock terminal and first power supply terminal, third and fourth transistors connected between the refresh terminal and the first power supply terminal, and fifth and sixth transistors connected between a second power supply terminal and the first power supply. Gates of the fourth and fifth transistors are connected to an input terminal, a gate of the third transistor is connected to a second clock terminal, a gate of the first transistor is connected to a node between the fifth and sixth transistors, gates of the second and sixth transistors are connected, and a node between the first and second transistors is connected to an output terminal.

4 Claims, 23 Drawing Sheets

VDD RF 1000₁ MN05 IN MN03 MN01 N01 OUT MN06 MN02 N02 MN04 VSS VSS VSS RF 1000₂ VDD MN17 MN15 MN13 MN11 N11 OUT MN16 MN12 N12 MN14 VSS VSS VSS CLK1 CLK2

U.S. PATENT DOCUMENTS

| | | | | |
|---|---|---|---|---|
| 2006/0061562 | A1* | 3/2006 | Park et al. | 345/204 |
| 2006/0220587 | A1* | 10/2006 | Tobita et al. | 315/194 |
| 2007/0237285 | A1* | 10/2007 | Chien et al. | 377/64 |
| 2007/0274432 | A1* | 11/2007 | Yu | 377/64 |
| 2008/0252790 | A1* | 10/2008 | Serizawa | 348/663 |
| 2008/0298109 | A1* | 12/2008 | Breton et al. | 365/45 |

FOREIGN PATENT DOCUMENTS

| | | |
|---|---|---|
| JP | 2000-155550 | 6/2000 |
| JP | 2004-46054 | 2/2004 |
| JP | 2004-78172 | 3/2004 |
| JP | 2005-242313 | 9/2005 |

OTHER PUBLICATIONS

Notice of Grounds for Rejection from Japanese Official Action mailed Sep. 6, 2011 in Japanese Patent Application No. 2006-318634 and Partial English Translation.

* cited by examiner

SHIFT REGISTER 1000
C2
RF
C1
VDD
MN5
IN
MN3
N1
MN1
OUT
MN6
MN2
N2
MN4
VSS
VSS
VSS

LASER
2002
2001
2000

2002
2002
2002

2003
2003
2003

2005
2005
2005
2004

2007

2008
2008
2008
2007

2009
2009

NMOS TFT
NMOS TFT
CAPACITOR

LASER
2002
2001
2000

2002
2002
2002

2003
2003
2003

2005
2005
2005
2004

2007

2008
2008
2008
2007

2009
2009

PMOS TFT
PMOS TFT
CAPACITOR

SEMICONDUCTOR CIRCUIT, SCANNING CIRCUIT AND DISPLAY DEVICE USING THESE CIRCUITS

REFERENCE TO RELATED APPLICATION

This application is based upon and claims the benefit of the priority of Japanese patent application No. 2006-318634, filed on Nov. 27, 2006, the disclosure of which is incorporated herein in its entirety by reference thereto.

FIELD OF THE INVENTION

This invention relates to a semiconductor circuit and to a semiconductor device using this circuit. More particularly, the invention relates to a semiconductor circuit constructed using thin-film transistors that are only N-channel transistors or only P-channel transistors.

BACKGROUND OF THE INVENTION

An typical active-matrix type liquid crystal display combined with an active-matrix type driver circuits on a same substrate will be described. For forming driver circuits on the same substrate of a display panel, the polysilicon TFTs are applied in manufacture processes. In the past, polysilicon TFTs (thin-film transistors) formed on an insulating substrate required expensive quartz substrates owing to the high-temperature processes involved in manufacture. Such TFTs have been applied to display panels of small size, and high added value and expensive.

That was followed by the development of techniques for forming a pre-film by low-pressure (LP) CVD (chemical vapor deposition), plasma (P) CVD or sputtering, etc., and annealing the pre-film using a laser to thereby form a polycrystalline, namely techniques whereby a polysilicon TFT can be formed at low temperature such that a glass substrate or the like can be used.

At the same time, advances have been made in techniques for forming oxide films, techniques for micro-manufacturing, and circuit design techniques. As a result, it has become possible to form polysilicon TFT display panels for mobile telephones, mobile information terminals and notebook personal computers. These display panels have peripheral circuits of the display panel integrated on the same substrate on which pixels are formed.

Patent Document 1 (Japanese Patent Kokai Publication No. JP2004-046054A) can be mentioned as a specific example.

FIG. 16 is a block diagram illustrating an example of the configuration of the display system of a liquid crystal display device combined with a driver circuit disclosed in Patent Document 1.

In this liquid crystal display device combined with driver circuits, as shown in FIG. 16, an active-matrix display area 110, in which pixels of M rows and N columns are arrayed in the form of a matrix, a row-direction scan circuit [scan line (gate-line) driver circuit] 109, a column-direction scan circuit (data-line driving circuit) 3504, an analog switch 3505 and a level shifter 3503 are formed integrally by polysilicon TFTs on a display device substrate 101.

A controller 113, a memory 111, a digital/analog converter (DAC) circuit 3502 and a scan circuit/data register 3501, etc., are mounted external to the display device substrate 101 in the form of an integrated circuit chip (IC chip) which is formed on a wafer of monocrystalline silicon. The analog switch 3505 has outputs the number of which is the same as the number N of column-direction data lines of the active-matrix display area 110.

Further, the liquid crystal display devices combined with driver circuits composed of polysilicon TFTs also include devices formed in combination with more complicated circuits, such as a DAC circuit.

FIG. 17 is a block diagram illustrating an example of the typical configuration of the display system of a liquid crystal display device having a built-in DAC circuit.

In the liquid crystal display device having the built-in DAC circuit, the following circuits are formed on the display device substrate 101 in addition to the active-matrix display area 110, in which pixels of M rows and N columns are arrayed in the form of a matrix, the row-direction scan circuit 109 and a column-direction scan circuit 3506 similar to those of the device in FIG. 16 not having the built-in DAC circuit: a data register 3507, a latch circuit 105, a DAC circuit 106, a selector circuit 107 and a level shifter/timing buffer 108.

According to this arrangement, the controller IC mounted externally of the display device substrate 101 does not include the DAC circuit, which uses a high voltage, and the memory 111, an output buffer 112 and the controller 113 can all implemented by low-voltage circuit and elements. As a result, the IC can be fabricated without making joint use of a high-voltage process that makes it necessary to generate a voltage signal for the purpose of writing signals to liquid crystal. This means that the cost is kept below that of the above-mentioned IC having a DAC as shown in FIG. 16.

The liquid crystal display device set forth above is thin and light in weight. This feature is exploited to mount such liquid crystal display devices on mobile information processing equipment.

The liquid crystal display described above is an example of a display device combined with driver circuits having the CMOS (Complementary Metal-Oxide Semiconductor) configuration. Owing to use of the CMOS configuration, a shift register circuit constituting the above-mentioned row-direction scan circuit 109 or column-direction scan circuit 3506 can be realized by a static circuit that employs an inverter circuit and clock inverter circuit.

A display device combined with a drive circuit is not limited to one based upon a CMOS-type TFT circuit. There has also been proposed a display device combined with a drive circuit composed of so-called single-channel TFTs, which is composed of TFTs only of NMOS-type or only of PMOS-type. In comparison with a CMOS-based TFT circuit, a single-channel TFT circuit uses a smaller number of layers. This makes it possible to reduce the number photomasks and to shorten manufacturing time. As a result, the cost of device manufacture can be reduced in comparison with the CMOS-based TFT circuit.

<Two-Clock Arrangement>

An arrangement disclosed in Patent Document 2 (Japanese Patent Kokai Publication No. JP2004-78172A) illustrates an example of a circuit using the above-mentioned single-channel TFTs. FIG. 18 is a block diagram of a shift register according to Patent Document 2 (Japanese Patent Kokai Publication No. JP2004-78172A); FIG. 19 is a diagram illustrating the specific circuitry of the shift register of Patent Document 2 (Japanese Patent Kokai Publication No. JP2004-78172A); FIG. 20 is an output waveform diagram of the shift register of Patent Document 2 (Japanese Patent Kokai Publication No. JP2004-78172A); and FIG. 21 is a waveform diagram useful in describing driving waveforms based upon the shift register of Patent Document 2 (Japanese Patent Kokai Publication No. JP2004-78172A).

As illustrated in FIG. 18, the shift register has nine cascade-connected stages (SRH1 to SRH9). That is, each stage has an output terminal (OUT) connected to an input terminal (IN) of the next stage.

The nine stages include eight stages (SRH1 to SRH8) corresponding to data-line blocks, and one dummy stage (SRH9). Each stage has the input terminal (IN), the output terminal (OUT), a control terminal (CT), a clock input terminal (CK), a first power-supply voltage terminal (VSS) and a second power-supply voltage terminal (VDD).

The eight stages (SRH1 to SRH8) supply block selection terminals of data-line blocks (BL1 to BL8) with block-selection start signals (DE1 to DE8), respectively. The block-selection start signals are enable signals of the line blocks.

The operation of each stage will be described with reference to FIGS. 19, 20 and 21.

FIG. 19 shows the circuit configuration of a Nth stage the shift register 164 in FIG. 18. In FIG. 19, a GOUT[N−1] is a signal supplied from a (N−1)th stage of the shift register, wherein in case of N=1, GOUT[N−1] is STH in FIG. 18). A GOUT[N+1] is an output signal from a (N+1)th stage, and a GOUT[N] is an output signal output of the Nth stage of the shift register, Responsive to the rising edge of a scan start signal (STV) which is supplied to the gate (N1) of a transistor M3 of a pull-up driver 173 through the input terminal (IN), the transistor M3 is turned on to charge a capacitor (C) of a pull-up circuit 171. By the way, the scan start signal (STV) in FIG. 20 corresponds to the signal STH supplied to the first stage SRH1 of the shift register 164 in FIG. 18. As a result, a pull-up transistor M1 is turned on and a high-level interval of a first clock (CKV) appears at the output terminal.

When the high-level interval of the clock signal appears at the output terminal (OUT in FIG. 18, which corresponds to a GOUT[N] in FIG. 19), the output voltage is boot-strapped in the capacitor (C) and the gate-line driving voltage of the pull-up transistor M1 rises above the turn-on voltage (VON).

Meanwhile, before input of a start signal, a first node (N1) is set to a second power-supply voltage (VON) by a sixth transistor M6 of a pull-down driver 174, whereby a second transistor M2 is turned on. Accordingly, the voltage of the output signal at the output terminal (OUT in FIG. 18, which corresponds to a GOUT[N] in FIG. 19) is at the state of the first power-supply voltage (VOFF). When the scan start signal (STV) is input, a seventh transistor M7 is turned off.

When the potential at a second node (N2) starts rising through the sixth transistor M6, a fourth transistor M4 starts turning on, whereby the voltage charged in the capacitor (C) starts discharging through the fourth transistor. As a result, the pull-up transistor M1 also starts turning off. The output signal GOUT(N+1) of the next stage which is supplied to the control terminal of fifth transistor M5 then rises to the turn-on voltage. The fifth transistor M5, therefore, turns on.

Further, the second node (N2) turns on and the output terminal OUT falls to the turn-off voltage (VOFF) owing to the turn-on voltage (VON).

By virtue of the above-described operation, each of the stages operates and output signals GOUT[1] to GOUT[4] are generated successively in such a manner that operation is stabilized.

<Four-Clock Arrangement>

Patent Document 3 (Japanese Patent Kokai Publication No. JP2000-155550A) discloses a circuit of the kind shown in FIG. 22 as a circuit arrangement controlled by four clock signals (C1 to C4). The arrangement comprises a first NMOS transistor T1 to a sixth NMOS transistor T6 and capacitors CAP1, CL1 and C12. Operation of the circuit will be described with reference to FIGS. 22 and 23.

When a high level is attained at a first node P1, a transistor T5 turns on. If clock signal C1 rises to the high logic level under these conditions, an output line 14*i* charges the high-level voltage of clock signal C1 supplied via the drain and source of transistor T5.

When the high-level clock signal C1 is supplied to the output line 14*i*, the capacitor CAP1 raises the voltage of the first node P1 up to the voltage level of the clock signal C1. Owing to an increase in the gate voltage by the capacitor CAP1, the transistor T5 transfers the high-level clock signal C1 to the output line 14*i* without attenuating the signal.

When the clock signal C1 transitions from the high to a low level, the voltage of the output line 14*i* also similarly transitions to a low level. This is ascribable to the fact that the transistor T5 is held in the turned-on state by the potential at the first node P1.

Next, when clock signal C3 transitions from the low to the high level, a transistor T3 turns on in such a manner that the voltage at node P2 will have a high level.

The transistor T2 also is turned on by the high-level voltage at the second node P2 supplied to its own gate, thereby discharging the electric charge on the first node P1 to VSS which is connected to VSSL.

Similarly, with regard to a transistor T6, the output signal of output line 14*i* falls to a low level in response to a high level at the second node P2 supplied to the gate of transistor T6.

[Patent Document 1]

Japanese Patent Kokai Publication No. JP2004-046054A (pp. 31-32, FIGS. 37, 38)

[Patent Document 2]

Japanese Patent Kokai Publication No. JP2004-78172A (pp. 36-37, FIGS. 5-9)

[Patent Document 3]

Japanese Patent Kokai Publication No. JP2000-155550A (p. 27, FIGS. 1, 2, 3)

The entire disclosures of Patent Documents 1 to 3 are incorporated by reference into the present application. The analysis described below is given by the present invention.

The above mentioned examples have the problems set forth below.

<Problem With Two-Clock Arrangement>

In the case of the arrangement disclosed in Patent Document 2 (Japanese Patent Kokai Publication No. JP2004-78172A), it is necessary to hold the transistor M2 in FIG. 19 in an ON state in order to maintain GOUT[N] in an OFF state. Further, after the potential at node N2 is reset to a high level by GOUT of the next stage following its own output, it is necessary to hold node N2 at a high level until the timing at which the next output is made. With this arrangement, the potential at node N2 gradually falls from a high level owing to leakage current of transistor M7 whose source and drain are connected to node N2.

Consequently, the current driving capability of transistor M2 declines, as a result of which it is difficult to hold GOUT [N] in an OFF state. That is, the gate of transistor M1 is placed in an open state.

Under these conditions, the potential at the gate of transistor M1 is subjected to fluctuations owing to the pulse of the signal CKV or CKVB connected to the source of transistor M1. As a consequence, the signal CKV or CKVB is output from GOUT[N] as GOUT[N] as is.

That is, in Patent Document 2, erroneous operation in which an output is produced at a timing at which output is unnecessary is brought about by leakage current from the transistor.

In particular, since a thin-film transistor that has been fabricated on a glass substrate uses a glass substrate that is permeable to light, optical leakage current due to irradiation with light also is produced.

Further, in a case where use is made of a polysilicon layer that has undergone re-crystallization by irradiating a silicon layer serving as a channel portion with an excimer laser, for example, variations in the size and density of the recrystallized crystal grains occur. This leads to fluctuations in transistor characteristics.

When it is attempted to implement the circuit of Patent Document 2 using thin-film transistors, therefore, there are cases where the circuit malfunctions owing to the fluctuation in transistor characteristics.

<Problem With Four-Clock Arrangement>

Next, in the case of Patent Document 3 (Japanese Patent Kokai Publication No. JP2000-155550A), it is necessary that the first node P1 and second node P2 be held at low and high levels, respectively, in order to maintain the OFF state of the output 14*i* in FIG. 22. That is, it is necessary that transistor T5 whose gate is connected to the first node P1 be set in an OFF state and that transistor T6 whose gate is connected to the second node P2 be set in an ON state.

There is a possibility that the potential at the second node P2 will gradually decline from a high level owing to fluctuations in the characteristics of transistor T4 or T3. The arrangement of FIG. 22 resets the second node P2 to a high level using the clock signal C3, as illustrated in FIG. 23, in order to deal with the fluctuation factor. Such an operation makes it possible to suppress malfunction due to floating of the second node P2.

With the arrangement of Patent Document 3, however, a separate problem arises, namely an increase in the number of clock signals. Consequently, because the arrangement described in Patent Document 3 is implemented by thin-film transistors, either the problem of circuit malfunction due to fluctuations in transistor characteristics or the problem of an increase in number of clock signals is the result.

SUMMARY OF THE DISCLOSURE

Accordingly, an object of the present invention is to provide a semiconductor circuit that improves the margin of circuit operation with respect to fluctuations in transistor characteristics without increasing the number of clock signals, a scan circuit having this semiconductor circuit and a display device having the scan circuit.

According to an aspect of the present invention, there is provided a semiconductor circuit for performing drive upon receiving a clock signal and either a start signal or an output signal of a preceding stage, wherein with the circuit itself in an inactive state, any floating node in the circuit is refreshed using a signal having a period shorter than that of the clock signal.

According to another aspect of the present invention, there is provided a semiconductor circuit for performing drive upon receiving a clock signal and either a start signal or an output signal of a preceding stage, wherein with the circuit itself in an inactive state, any floating node in the circuit is refreshed using a signal having a period shorter than that of the clock signal, and the potential of a floating node different from the floating node of the preceding stage.

According to another aspect of the present invention, there is provided a shift register circuit comprising a plurality of stages of circuit elements cascade-connected each other; wherein each circuit element has means, which receives as inputs at least first and second clock signals and a control signal having a period shorter than that of at least one of the first and second clock signals, for generating an output signal in response to activation of the control signal, the output signal is transferred to an adjacent one of the circuit elements and the plurality of circuit elements are activated one after another, each circuit element including the semiconductor circuit described above.

In the shift register of the present invention, the control signal is held at a predetermined prescribed logic value in a period in which a circuit element of an initial stage is active.

According to still another aspect of the present invention, there is provided a display device comprising a pixel array in which a plurality of pixels are arrayed, and control circuits for activating the pixels; wherein at least one of the control circuits includes the shift register circuit described above.

A display device according to the present invention comprises a pixel array in which a plurality of pixels are arrayed, a gate-line driving circuit for activating the pixels, and a data-line driving circuit for applying a prescribed voltage to the pixels, wherein the gate-line driving circuit includes the shift register circuit described above, and the control signal serves also as a signal for controlling the data-line driving circuit.

A display device according to the present invention comprises a pixel array in which a plurality of pixels are arrayed, a gate-line driving circuit for activating the pixels, a precharging circuit for setting the pixels to a prescribed voltage, and a data-line driving circuit for applying a video signal voltage to the pixels, wherein the gate-line driving circuit includes the shift register circuit described above, and the control signal serves also as a signal for controlling the precharging circuit.

According to another aspect of the present invention, there is provided a semiconductor circuit comprising: first and second transistors connected between a first clock terminal and a first power supply; third and fourth transistors connected between a refresh terminal and the first power supply; and fifth and sixth transistors connected between a second power supply and the first power supply; wherein the fourth and fifth transistors have respective control terminals connected in common to a signal input terminal; the third transistor has a control terminal connected to a second clock terminal; the first transistor has a control terminal connected to a node at which the fifth and sixth transistors are connected; the second transistor has a control terminal connected to a control terminal of the sixth transistor; a node at which the first and second transistors are connected is connected to an output terminal; and the period of a signal that is supplied to the refresh terminal is shorter than the period of clock signals that are input to the first and second clock terminals.

According to another aspect of the present invention, the is provided a semiconductor circuit comprising first and second shift registers; wherein the first shift register includes: first and second transistors connected between a first clock terminal and a first power supply; third and fourth transistors connected between a refresh terminal and the first power supply; and fifth and sixth transistors connected between a second power supply and the first power supply; wherein the fourth and fifth transistors have respective control terminals connected in common to a signal input terminal of the first shift register; the third transistor has a control terminal connected to a second clock terminal; the first transistor has a control terminal connected to a node at which the fifth and sixth transistors are connected; the second transistor has a control terminal connected to a control terminal of the sixth transistor; and a node at which the first and second transistors are connected is connected to an output terminal of the first shift register. The second shift register includes: seventh and eighth transistors connected between the second clock terminal and the first power supply; ninth, tenth and eleventh transistors connected between the refresh terminal and the first power supply; and $12^{th}$ and $13^{th}$ transistors connected between the second power supply and the first power supply; wherein the $11^{th}$ and $12^{th}$ transistors have respective control terminals connected in common to the output terminal of the first shift register; the ninth transistor has a control terminal connected to the control terminals of the second and sixth transistors; the tenth transistor has a control terminal connected to the first clock terminal; the seventh transistor has a control terminal connected to a node at which the $12^{th}$ and $13^{th}$ transistors are connected; the eighth transistor has a control terminal connected to a control terminal of the $13^{th}$ transistor; and a node at which the seventh and eighth transistors are connected is connected to an output terminal of the second shift register. The refresh terminal and first and second clock terminals of the first and second shift registers are connected to a refresh signal line and first and second clock signal lines, respectively; the first and second clock signals are complementary, and the period of the signal input to the refresh terminal is shorter than the period of the clock signals that are input to the first and second clock terminals.

The meritorious effects of the present invention are summarized as follows.

In accordance with the present invention, it is possible to provide a semiconductor circuit in which the margin of circuit operation with respect to fluctuations in transistor characteristics is improved without increasing the number of clock signals, a scan circuit using this semiconductor circuit or a display device using the semiconductor circuit and scan circuit. In the display device according to the present invention, refresh is performed utilizing a control signal employed in another semiconductor circuit. This means that a control signal is not provided anew.

In the present invention, refresh is performed using a signal having a period shorter than that of the clock signal. As a result, an abnormal output due to a change in potential at a floating node does not occur. This makes it possible to improve the robustness of a semiconductor device to leakage.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

The present invention will now be described in detail with reference to the accompanying drawings.

First Example

Figure 1:
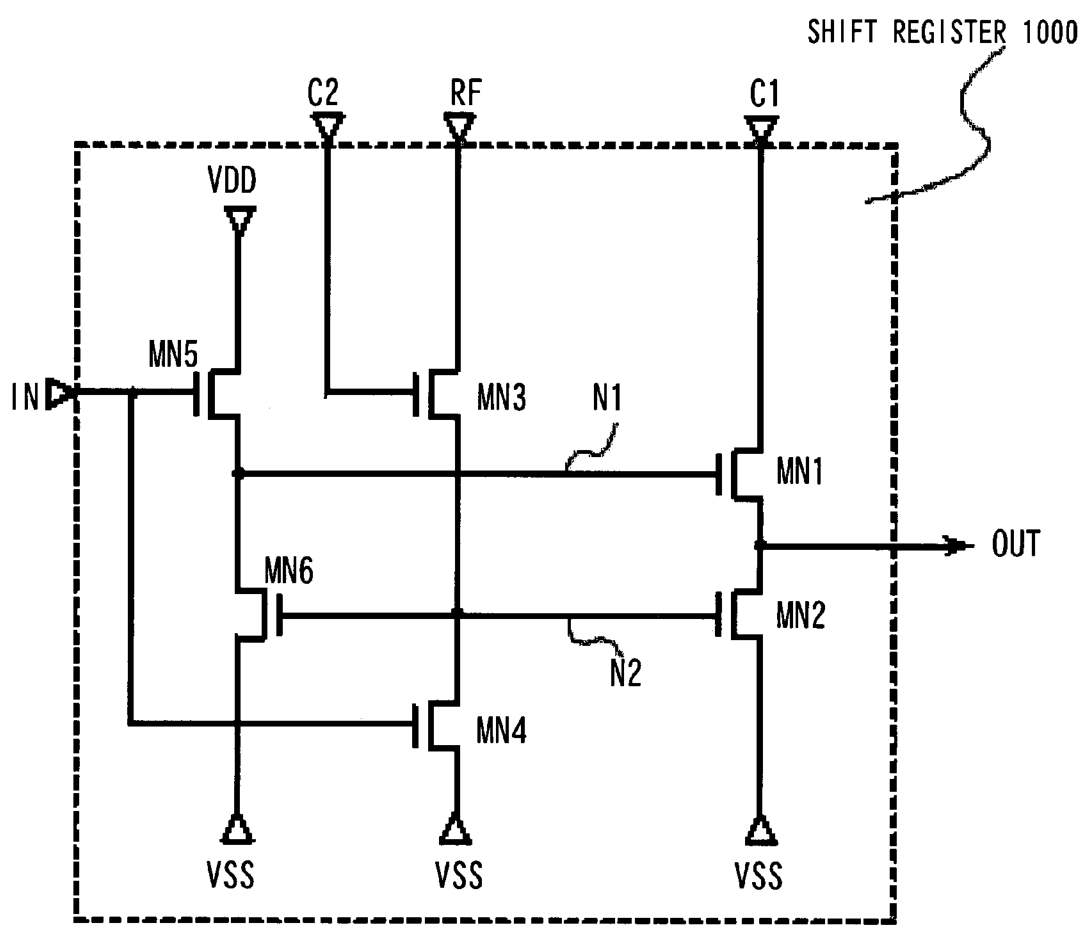
FIG. 1 is a diagram illustrating the arrangement of a first example of the present invention.
Figure 2:
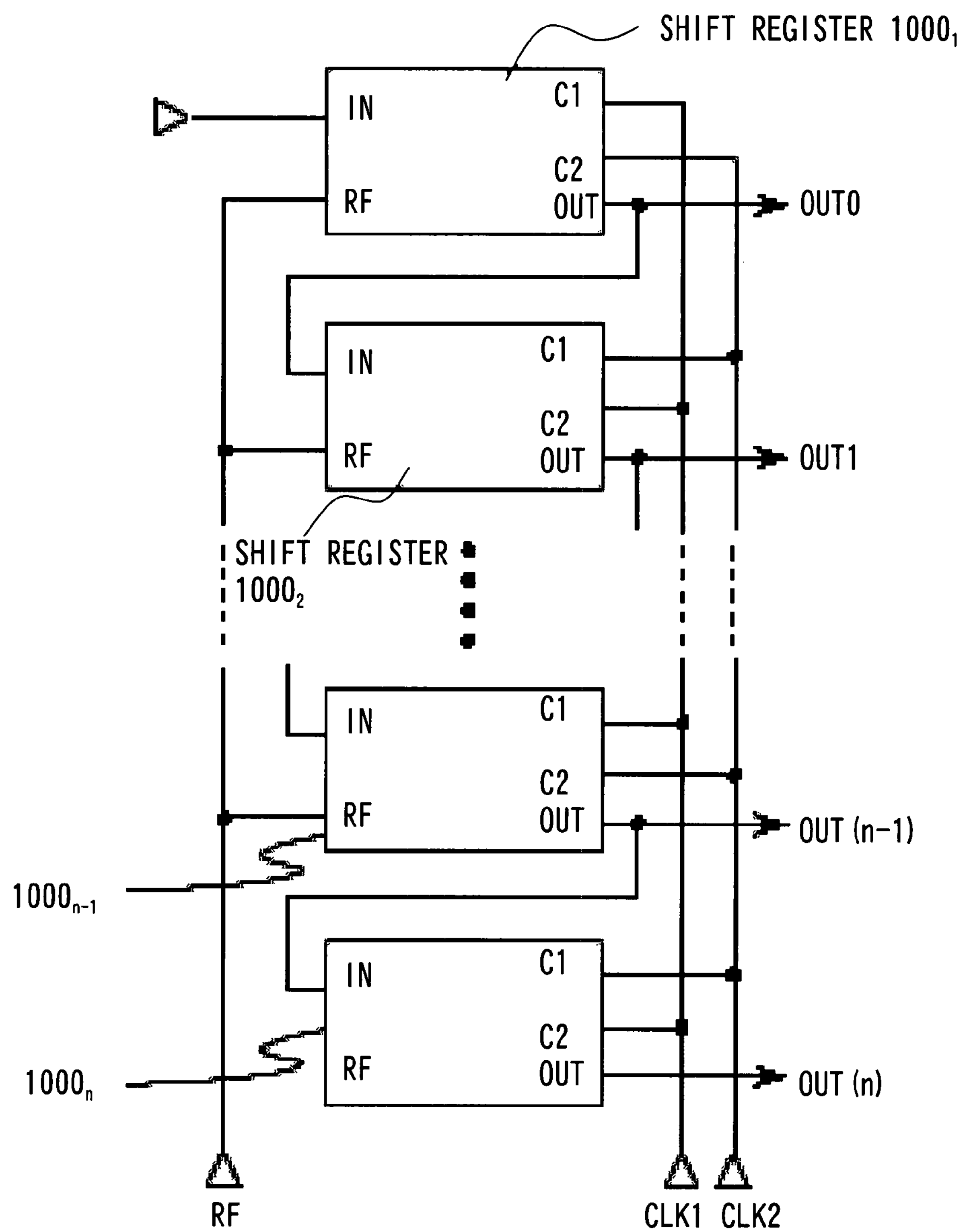
FIG. 2 is a diagram illustrating the arrangement of a first example of the present invention.

FIG. 1 is a diagram illustrating the arrangement of a semiconductor circuit according to a first example of the present invention, and FIG. 2 is a diagram illustrating an example of an arrangement in which a shift register (semiconductor circuit) 1000 shown in FIG. 1 is provided as a basic circuit unit. The physical shape and size of each N-channel MOS transistor (referred to as an NMOS transistor) may be designed within limits in which circuit operation is possible with a sufficient operating margin.

In the example illustrated in FIG. 1, though it does not represent any particular limitation, as control signals, first and second clock signals (CLK1 and CLK2) are input from first and second clock terminals C1, C2, respectively, a start signal (ST) is input from a signal input terminal IN and a refresh signal (RF) is input from a terminal RF, and an output signal (OUT) is output from an output terminal OUT. More specifically, as shown in FIG. 1, the shift register 1000 includes an NMOS transistor MN5 having a drain connected to a high-potential power supply VDD and a gate connected to the terminal IN; an NMOS transistor MN6 having a drain connected to the source (node N1) of NMOS transistor MN5 and a source connected to a low-potential power supply VSS; an NMOS transistor MN3 having a drain connected to the terminal RF and a gate connected to the terminal C2; an NMOS transistor MN4 having a drain connected to the source of NMOS transistor MN3, a gate connected to the terminal IN and a source connected to the low-potential power supply VSS; an NMOS transistor MN1 having a drain connected to the first clock terminal C1 and a gate connected to the node N1; and an NMOS transistor MN2 having a drain connected to the source of NMOS transistor MN1, a gate connected to the gate of NMOS transistor MN6 and a source connected to the low-potential power supply VSS. A node at which the source of NMOS transistor MN1 and the drain of NMOS transistor MN2 are connected serves as the output terminal OUT. The commonly connected gates of the NMOS transistors MN6, MN2 serve as a node N2. This example is such that the NMOS transistor MN3 is controlled using the second clock CLK2 and refresh signal (RF).

In FIG. 2, there are shown n stages (where n is a prescribed positive integer) of the shift register 1000 of FIG. 1, as a basic circuit unit are cascade-connected.

Referring to FIG. 2, the signal IN (start signal ST) is supplied to a shift register $\mathbf{1000}_1$, and the output of the shift register $\mathbf{1000}_1$ is supplied to input terminal IN of a shift register $\mathbf{1000}_2$. Similarly, the output of a shift register $\mathbf{1000}_{n-1}$ is supplied to the input terminal IN of a shift register $\mathbf{1000}_n$. The refresh signal RF and clock signals CLK1 and CLK2 are supplied in common to the terminal RF, and terminals C1 and C2, respectively of each shift register 1000.

Figure 3:
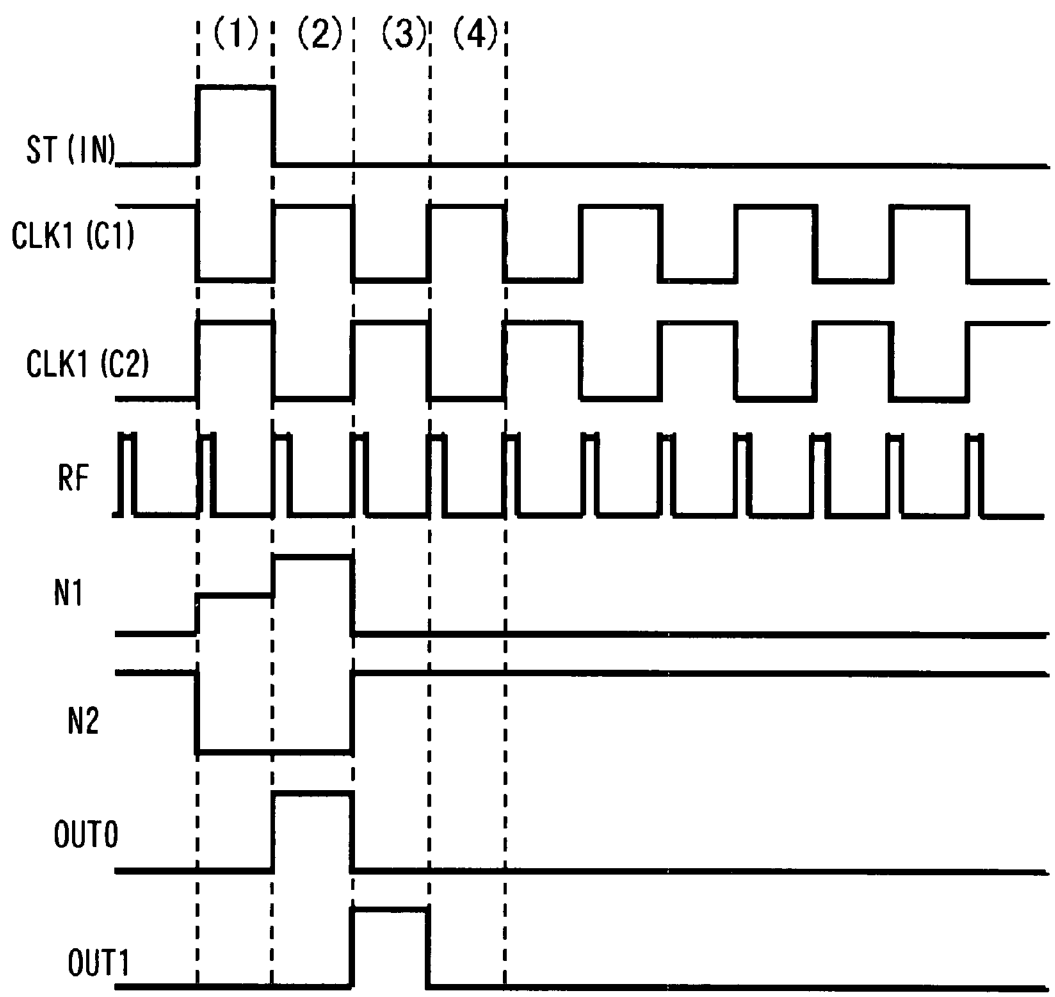
FIG. 3 is a timing chart useful in describing the operation of the first example.

FIG. 3 is a timing chart for describing the operation of this example. The operation of this example will be described with reference to FIGS. 1 to 3.

First, when the start signal ST at a high level is applied [(1) in FIG. 3] to the first shift register $\mathbf{1000}_1$ of FIG. 2, the transistors MN4 and MN5 of FIG. 1 are both turned on. As a result, the node N1 is set to a potential (VDD−VT), (where VT is a threshold-value voltage of the NMOS transistors) by the transistor MN5 that is in an ON state, and the node N2 is set to VSS by the transistor MN4, which is in an ON state.

Further, the node N2 rises to a high level temporarily when the refresh signal RF goes high. However, the node N2 falls to VSS again at the same time that RF returns to a low level. Meanwhile, as shown in FIG. 3, although no limitation is imposed on the present invention, the refresh signal RF is supplied as a high pulse signal which is generated so as to rise responsive to both rising and falling edges of a clock signal CLK1 and to have a pulse width smaller than each of a high period and a low period of the clock signal CLK1.

Next, when the start signal ST transitions to a low level and the clock signal CLK1 transitions to a high level [(2) in FIG. 3], the node N1 rises further from the potential (VDD−VT) owing to the bootstrap effect. As a result, the voltage applied to the gate of transistor MN1 rises and the output terminal OUT undergoes a transition to VDD.

Furthermore when the clock signal CLK1 transitions to a low level and the clock signal CLK2 transitions to a high level [(3) in FIG. 3), a low level of the clock signal CLK1 is transferred to the output terminal OUT, whereby the output terminal OUT undergoes a transition to a low level.

Further, since the refresh signal RF again transitions to the high level, the node N2 transitions from low to high [(4) in FIG. 3].

Next, the operation of the second shift register $\mathbf{1000}_2$ of FIG. 2 will be described.

The output terminal OUT of the preceding stage (the first shift register $\mathbf{1000}_1$) and not the control signal ST is connected to the ST node in the second shift register $\mathbf{1000}_2$.

That is, at (2) in FIG. 3, operation in a case where OUT0 goes high and operation in the second shift register $\mathbf{1000}_2$ in a case where the start signal ST goes high at ST in the first shift register $\mathbf{1000}_1$ are equivalent. In other words, from this point in time onward, the operation of the second shift register $\mathbf{1000}_2$ is the same as that of the first shift register $\mathbf{1000}_1$ except for the fact that use is made of the clock signal CLK2.

Thus, as illustrated in FIG. 3, output OUT1 of the $\mathbf{1000}_2$ transitions to a high level when the output OUT0 of the shift register $\mathbf{1000}_1$ goes low.

Each of the cascade-connected shift registers 1000 receives the OUT signal from the adjacent shift register 1000 and outputs the OUT signal.

According to the present invention, a node that is set into the floating state can be set to any potential once per one clock period by using the refresh signal RF. Accordingly, since the duration of the floating state is shortened, circuit malfunction due to fluctuations in transistor characteristics can be suppressed.

A method of manufacture according to the first example of the invention will be described below.

First, a method of manufacturing a TFT substrate according to the first example will be described with reference to FIGS. 4A to 4G.

FIGS. 4A to 4G illustrate a fabrication process of a TFT substrate in which NMOS TFTs and a capacitor are formed on a glass substrate 2000 by the polysilicon TFT technique.

After a silicon oxide film 2001 is formed on the glass substrate 2000, amorphous silicon 2002 is caused to grow on the film. The silicon oxide film 2001 is a layer which, by being interposed between the glass substrate 2000 and the amorphous silicon 2002, alleviates the effects of the glass substrate 2000 on the amorphous silicon 2002.

Figures 4A, 4B, 4C, 4D, 4E, 4F, 4G:
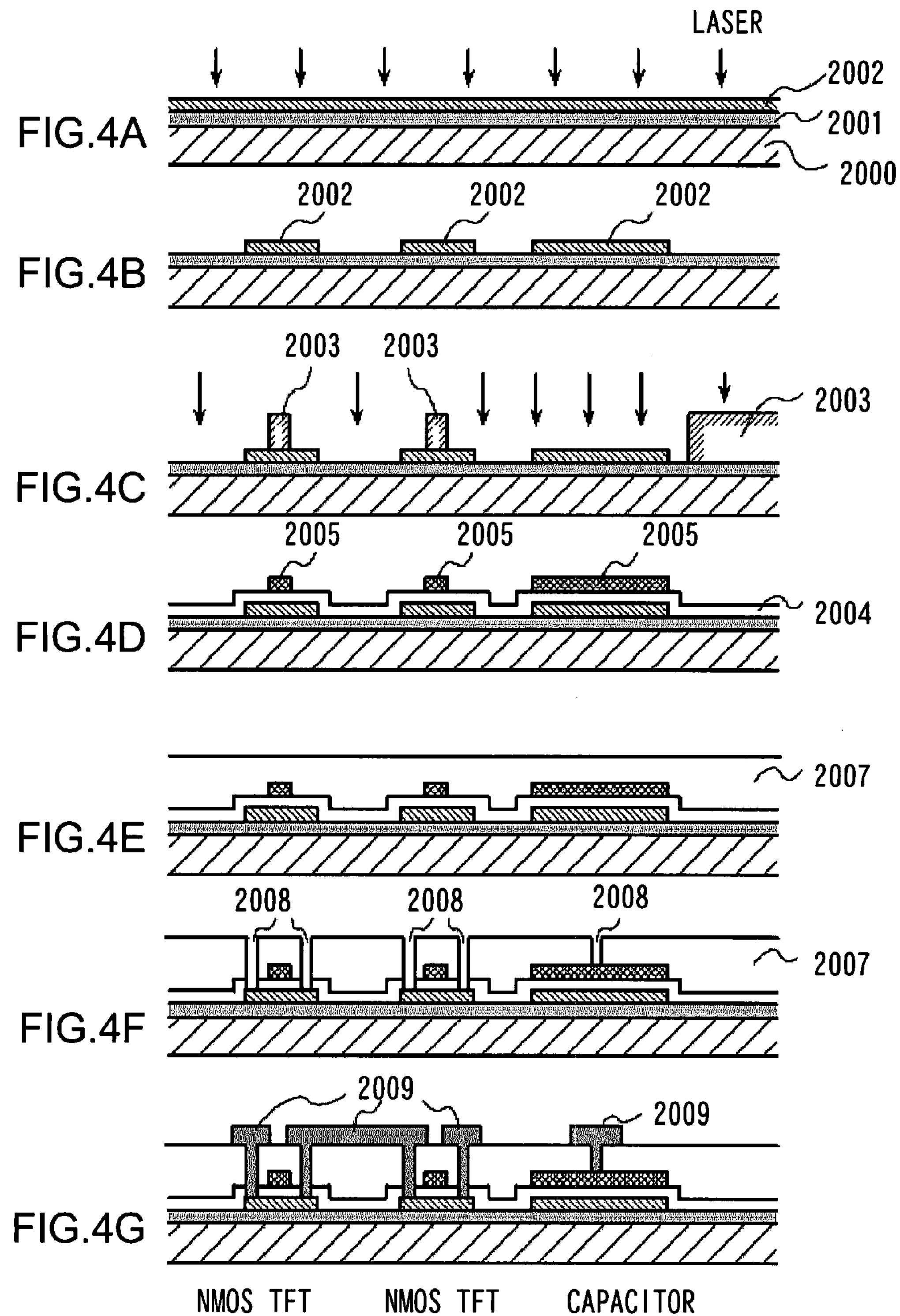
FIGS. 4A to 4G are process sectional views useful in describing a method of manufacturing a TFT substrate according to first and third examples of the present invention.

Next, annealing is performed using an excimer laser and the amorphous silicon is changed to polysilicon [FIG. 4A].

Next, the polysilicon 2002 is patterned using a photoresist and an etching process [FIG. 4B].

Furthermore, after a photoresist 2003 is spin-coated and then exposed to light and patterned, doping with phosphorous (P) is performed, thereby forming n-channel source and drain regions [FIG. 4C].

Next, a silicon oxide film 2004 having a film thickness of, e.g., 90 nm is grown, after which a layer composed of, e.g., microcrystalline silicon (μ-c-Si) and tungsten silicide (WSi) is grown and then patterned, thereby forming gate electrodes 2005 [FIG. 4D].

Next, after an interlayer film 2007 formed from a silicon oxide film or silicon nitride film is built up [FIG. 4E], contact holes 2008 are formed in the interlayer film 2007 [FIG. 4F].

Next, an electrode layer 2009 formed from aluminum or chrome, etc., is formed as by sputtering, and patterning is carried out [FIG. 4G].

With the above mentioned fabrication process, NMOS TFTs and a capacitor are formed.

Though an excimer laser is used to form the polysilicon film in this example, it is permissible to use other lasers, such as a continuous-wave (CW) laser, and it is permissible to use solid-phase growth employing a thermal treatment.

Thus, polysilicon TFTs are formed on the glass substrate 2000 through the process shown in FIGS. 4A to 4G.

Further, one of the merits of the above-described fabrication process of a TFT substrate is that it is possible to obtain high-density wiring on a substrate having a large surface area. This contributes to the implementation of a display device having a high-definition pixel array. The semiconductor circuit of the first example can be fabricated through the above-described process.

Second Example

Figure 5:
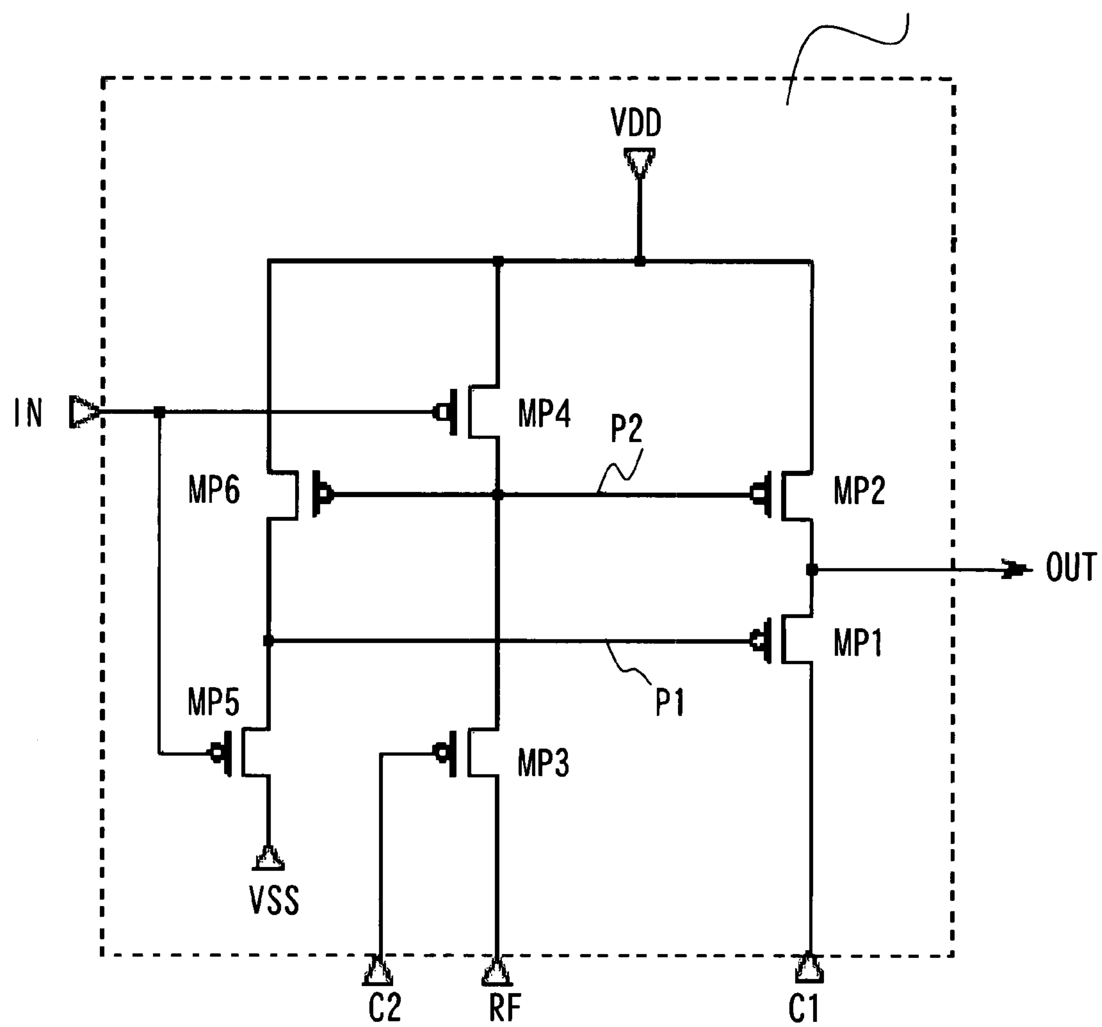
FIG. 5 is a diagram illustrating the arrangement of a second example of the present invention.

FIG. 5 is a diagram illustrating the arrangement of a second example of the present invention. The structural difference between this example and the first example is the polarity (conductivity type) of the transistors that construct the shift register 1000. Whereas the shift register is composed of NMOS transistors MN1 to MN6 in the first example, it is composed of PMOS transistors MP1 to MP6 in this example.

The physical shape and size of each P MOS transistor may be designed within limits in which circuit operation is possible with a sufficient operating margin. An OUT signal is output by inputting clock signals CLK1, CLK2, start signal ST and refresh signal RF as control signals.

As in the first example, the shift register 1000 in this example also has the configuration shown in FIG. 2.

Figure 6:
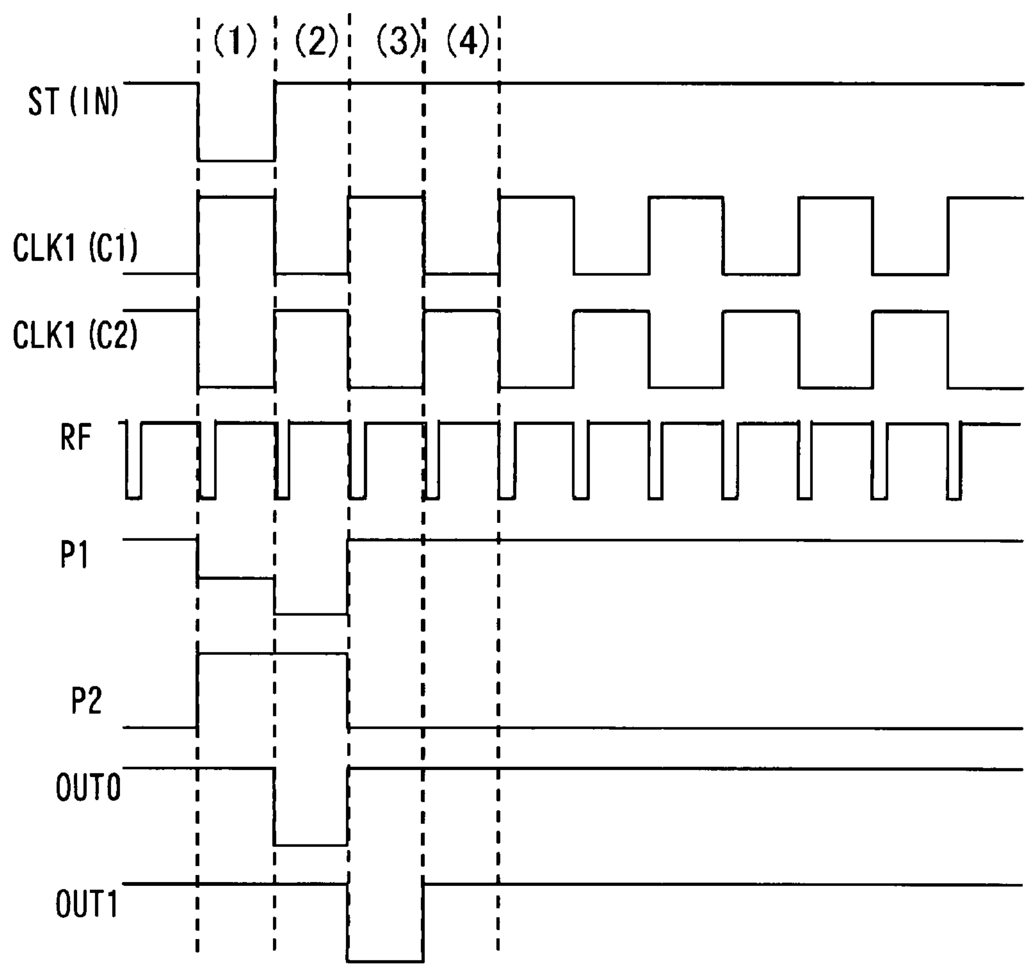
FIG. 6 is a timing chart useful in describing the operation of the second example.

FIG. 6 is a timing chart for describing the operation of this example. The operation of this example will be described with reference to FIGS. 2, 5 and 6.

First, when the start signal ST at a low level is applied [(1) in FIG. 6] to the first shift register $\mathbf{1000}_1$ (the circuit arrangement of which is that shown in FIG. 5), the transistors MP4 and MP5 of FIG. 1 are both turned on. As a result, node P1 is set to a potential (VSS+VT) by the transistor MP5, and node P2 is set to VDD by the transistor MP4. Here VT is a threshold value voltage of the transistors.

Further, the node P2 falls to a low level temporarily when the refresh signal RF goes low. However, the node N2 rises to VDD again at the same time that the refresh RF returns to the high level. Meanwhile, as shown in FIG. 6, although no limitation is imposed on the present invention, the refresh signal RF is supplied as a low pulse signal which is generated so as to fall responsive to both rising and falling edges of a clock signal CLK1 and to have a pulse width smaller than each of a high period and a low period of the clock signal CLK1.

Next, when the start signal ST transitions to a high level and the clock signal CLK1 transitions to a low level [(2) in FIG. 6], the node P1 falls further from the potential (VSS−VT) owing to the bootstrap effect. As a result, the voltage applied to the gate of transistor MP1 falls and the output terminal OUT undergoes a transition to VSS. Furthermore, when the clock signal CLK1 transitions to a high level and the clock signal CLK2 transitions to a low level [(3) in FIG. 6), a high level of the clock signal CLK1 is transferred to the output terminal OUT0, whereby the output terminal OUT0 undergoes a transition to the high level.

Further, since the refresh signal RF again transitions to a low level, the node P2 transitions from high to low [(3) in FIG. 6].

Next, the operation of the second shift register $\mathbf{1000}_2$ (the circuit arrangement of which is that shown in FIG. 5) will be described. The OUT signal (OUT0) of the preceding stage (the first shift register $\mathbf{1000}_1$) and not the control signal ST is supplied to the ST node in the second shift register $\mathbf{1000}_2$.

That is, at (2) in FIG. 6, operation in a case where OUT0 goes low and operation in a case where the start signal ST goes low in the first shift register $\mathbf{1000}_1$ are equivalent. From this point in time onward, the operation of the second shift register $\mathbf{1000}_2$ is the same as that of the first shift register $\mathbf{1000}_1$ except for the fact that use is made of the clock signal CLK2. When the output OUT0 of the shift register $\mathbf{1000}_1$ goes high, the output OUT1 of the shift register 10002 goes low [(3) in FIG. 6].

Thus, each of the plurality of cascade-connected shift registers 1000 receives the OUT signal from the adjacent shift register 1000 and outputs the OUT signal.

According to one of features of the present invention, a node that is set into the floating state can be set to any potential once per one clock period by using the refresh signal RF. Accordingly, since the duration of the floating state is shortened, circuit malfunction due to fluctuations in transistor characteristics can be suppressed.

Next, a method of manufacturing a TFT substrate according to the second example will be described with reference to FIGS. 7A to 7G. FIGS. 7A to 7G illustrate a fabrication process of a TFT substrate in which PMOS TFTs and a capacitor are formed on the glass substrate 2000 by the polysilicon TFT technique.

After the silicon oxide film 2001 is formed on the glass substrate 2000, amorphous silicon 2002 is caused to grow on the film. The silicon oxide film 2001 is a layer which, by being interposed between the glass substrate 2000 and the amorphous silicon 2002, alleviates the effects of the glass substrate 2000 on the amorphous silicon 2002.

Figures 7A, 7B, 7C, 7D, 7E, 7F, 7G:
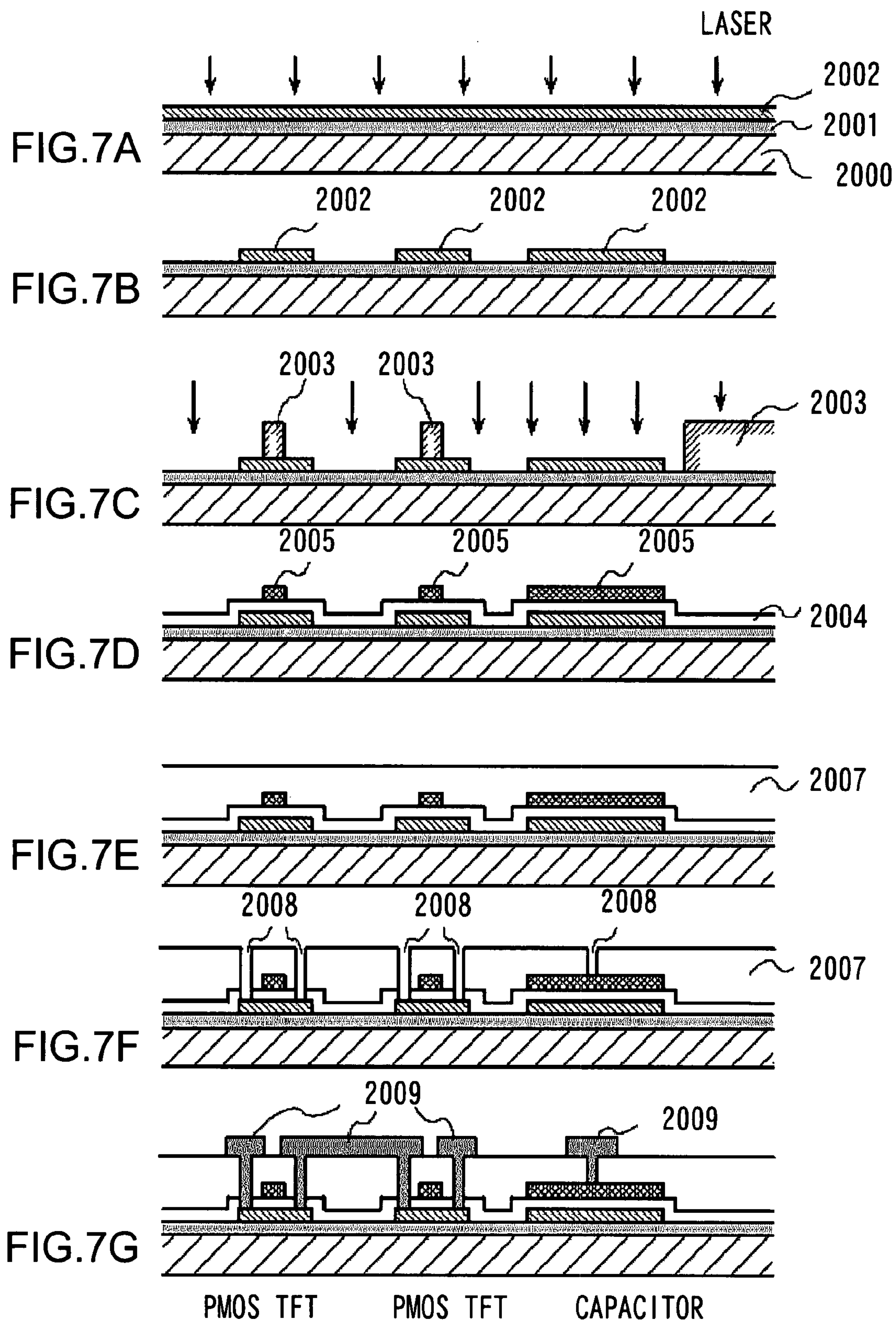
FIGS. 7A to 7G are process sectional views useful in describing a method of manufacturing a TFT substrate according to second and fourth examples of the present invention.

Next, annealing is performed using an excimer laser and the amorphous silicon is changed to polysilicon [FIG. 7A].

Next, the polysilicon 2002 is patterned using a photoresist and an etching process [FIG. 7B].

Furthermore, after the photoresist 2003 is spin-coated and then exposed to light and patterned, doping with p-type impurity such as boron s (B) is performed, thereby forming p-channel source and drain regions [FIG. 7C].

Next, the silicon oxide film 2004 having a film thickness of, e.g., 90 nm is grown, after which a layer composed of, e.g., microcrystalline silicon (μ-c-Si) and tungsten silicide (WSi) is grown and then patterned, thereby forming the gate electrodes 2005 [FIG. 7D].

Next, after the interlayer film 2007 formed from a silicon oxide film or silicon nitride film is built up [FIG. 7E], contact holes 2008 are formed in the interlayer film 2007 [FIG. 7F].

Next, the electrode layer 2009 formed from aluminum or chrome, etc., is formed as by sputtering, and patterning is carried out [FIG. 7G].

With the above mentioned fabrication process, p-channel TFTs and a capacitor are formed. Though an excimer laser is used to form the polysilicon film in this example, it is permissible to use other lasers, such as a continuous-wave (CW) laser, and it is permissible to use solid-phase growth employing a thermal treatment.

Thus, polysilicon TFTs are formed on the glass substrate 2000 through the process shown in FIGS. 7A to 7G.

Further, one of the merits of this processing for manufacturing a TFT substrate is that it is possible to obtain high-density wiring on a substrate having a large surface area. This contributes to the implementation of a display device having a high-definition pixel array. The display device of the second example can be fabricated through the above-described process.

Third Example

Figure 8:
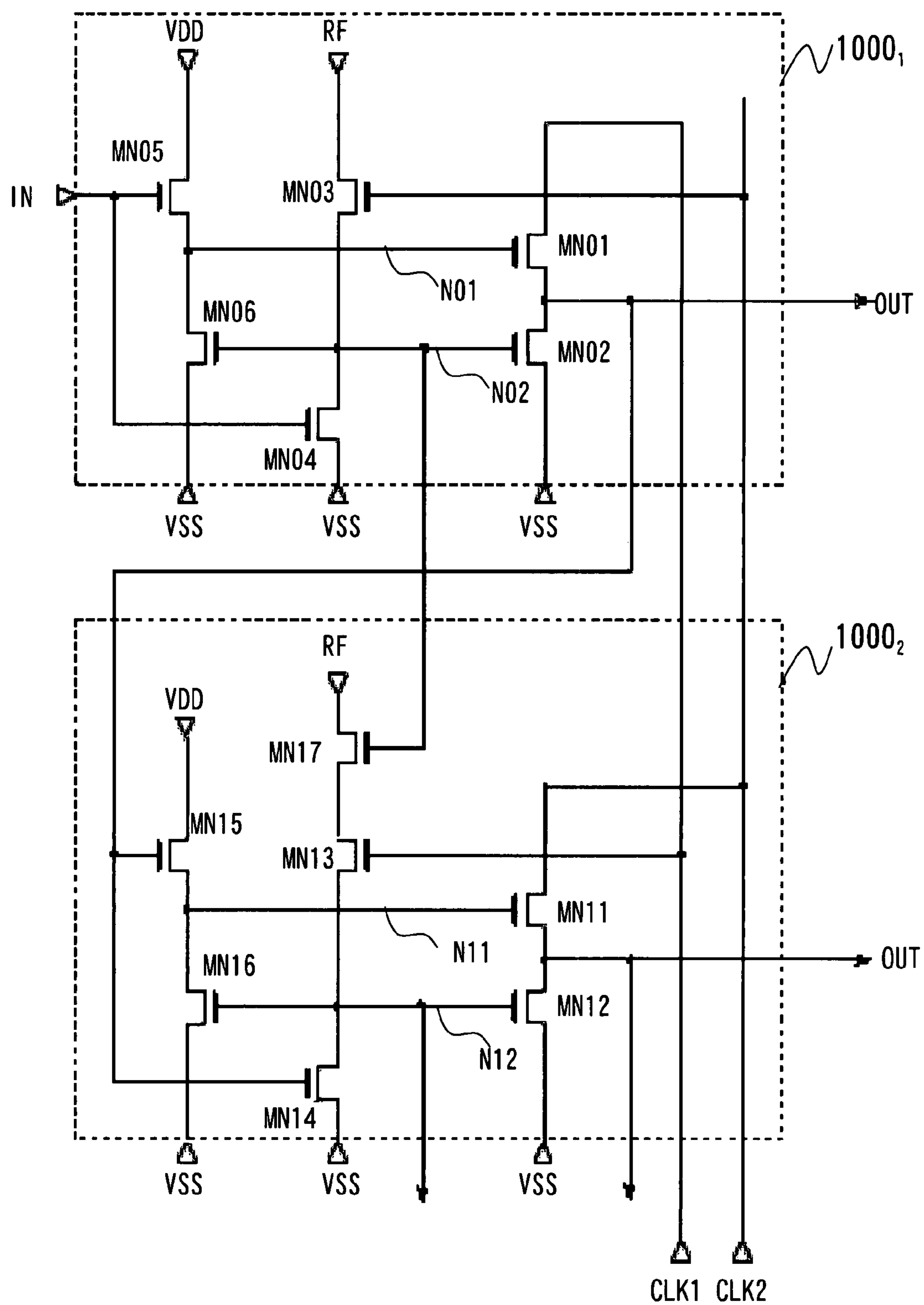
FIG. 8 is a diagram illustrating the arrangement of the third example.

The structure of a third example of the present invention will be described next. FIG. 8 is a diagram illustrating the arrangement of a third example of the present invention. As illustrated in FIG. 8, this example is such that the shift register $\mathbf{1000}_1$, which is the basic structural unit, is composed of NMOS transistors (MN01 to MN07).

FIG. 8 illustrates an arrangement in which two of the shift registers 1000 are connected together to form two stages. The structure of the shift register $\mathbf{1000}_1$ of the first stage comprises the components of FIG. 1 described above as the first example.

The structural difference between the shift register $\mathbf{1000}_2$ of the second stage (and subsequent stages) and the shift register $\mathbf{1000}_1$ of the first stage is the portion having cascode-connected NMOS transistors MN13 and MN17.

In the shift register $\mathbf{1000}_1$ of the first stage, a transistor MN03 controlled using the signals RF and CLK2 is connected to the RF terminal and a node N02. From the second stage onward, the transistors MN17 and MN13 are cascode-connected between the RF terminal and the node N02.

The transistor MN17 has a drain connected to the RF terminal and a gate to which the node N02 of the preceding stage, namely the first stage, is connected. The transistor MN13 has a gate to which the clock CLK1 is connected.

Further, it is preferred that the physical shape and size of each NMOS transistor be designed within limits in which circuit operation is possible with a sufficient operating margin.

An OUT signal is output by inputting clock signals CLK1, CLK2, start signal ST and refresh signal RF as control signals.

The operation of this example will be described with reference to the timing chart of FIG. 9. A characterizing feature of the third example is that the refresh signal RF is fixed at a low level in the period over which the shift register $\mathbf{1000}_1$ of the first stage is activated [namely through period (2) in FIG. 9].

Figure 9:
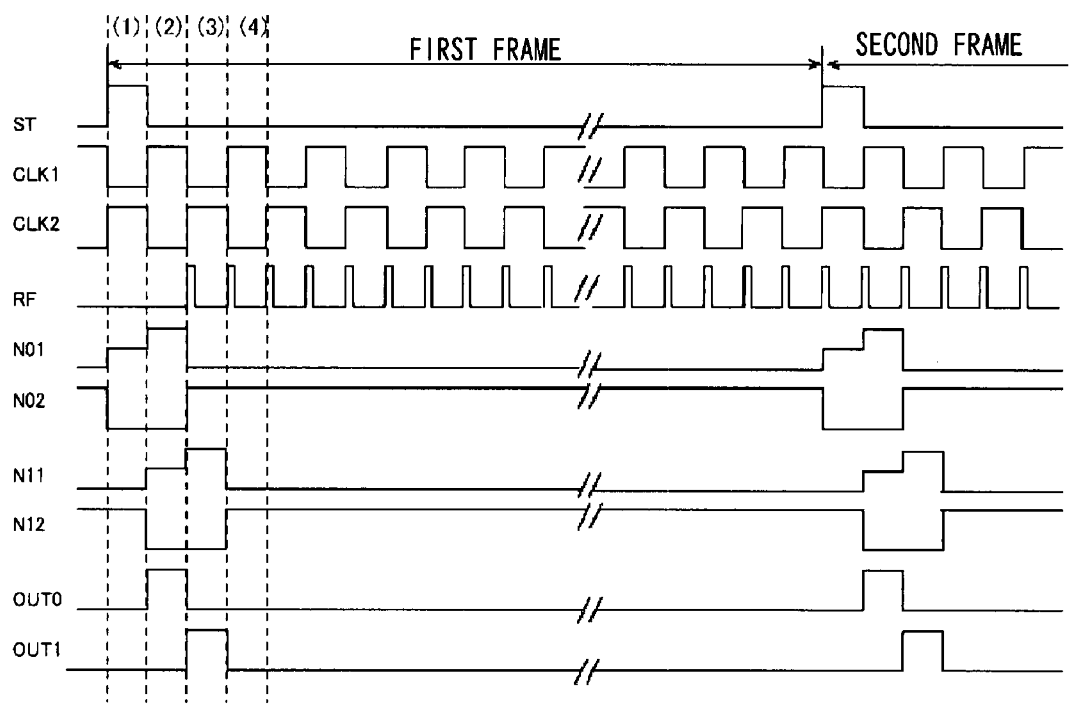
FIG. 9 is a timing chart useful in describing the operation of the third example.

When the start signal ST at a high level is supplied to the shift register $\mathbf{1000}_1$ of the first stage [(1) in FIG. 9] of FIG. 8, transistors MN04 and MN05 are both turned on.

As a result, node N01 is set to a potential (VDD−VT) by transistor MN05 and node N02 is set to VSS by transistor MN04. Here VT is a threshold value voltage of the transistors.

Next, when the start signal ST transitions to a low level and the clock signal CLK1 transitions to a high level [(2) in FIG. 9], the node N01 rises further from the potential (VDD−VT) owing to the bootstrap effect.

As a result, the voltage applied to the gate of transistor MN01 rises and the output OUT0 undergoes a transition to VDD.

Furthermore, when the clock signal CLK1 transitions to a low level and the clock signal CLK2 transitions to a high level [(3) in FIG. 9), a low level of the clock signal CLK1 is transferred to the output terminal OUT, whereby the output OUT0 undergoes a transition to a low level.

Further, since the refresh signal RF again transitions to the high level, the node N02 transitions from low to high [(3) in FIG. 9].

Next, the operation of the shift register $\mathbf{1000}_2$ of the second stage in FIG. 8 will be described.

The output OUT0 of the shift register $\mathbf{1000}_1$ of the preceding stage, i.e., the first stage, is connected to the gates of transistors MN14, MN15 in the shift register $\mathbf{1000}_2$ of the second stage. At (2) in FIG. 9, therefore, the operation of the shift register $\mathbf{1000}_2$ of the second stage starts at the moment the signal OUT0 transitions to the high level.

That is, the transistors MN14 and MN15 both turn on, node N11 is set to (VDD−VT) by transistor MN15 and node N12 is set to VSS by transistor MN14. Here VT represents the threshold value voltage of the transistors.

Next, when OUT0 transitions to a low level and the clock signal CLK2 transitions to a high level [(3) in FIG. 9], node N11 rises further from the potential (VDD−VT) owing to the bootstrap effect. As a result, the voltage applied to the gate of transistor MN11 rises and the output OUT1 undergoes a transition to VDD.

Furthermore, when the clock signal CLK2 transitions to a low level and the clock signal CLK1 transitions to the high level, a low level of the clock signal CLK2 is transferred to the output terminal OUT1, whereby the output OUT1 undergoes a transition to a low level [(4) in FIG. 9). The signal OUT1 is transferred to the shift register 1000 of a third stage, which is not shown.

Each of the thus cascade-connected shift registers 1000 starts operating upon receiving the OUT signal from the adjacent shift register 1000, whereby the OUT signal is output and transferred successively from stage to stage.

According to a feature of the present invention, a node that is set into the floating state can be set to any potential once per one clock period by using the refresh signal RF. Accordingly, since the duration of the floating state is shortened, circuit malfunction due to fluctuations in transistor characteristics can be suppressed.

Further, the refresh signal RF is fixed at a low level in the period over which the shift register $\mathbf{1000}_1$ of the first stage is activated. Therefore, even in a case where the transistors MN03 and MN04 in FIG. 8 attain an ON state simultaneously owing to the start signal ST and second clock signal CLK2, respectively, so that a conductive state is attained between the refresh terminal RF and VSS, the refresh terminal RF and VSS will be at the same potential and, hence, a short-circuit current will not be produced. In this example, therefore, it is possible to realize a shift register that consumes little power.

The method of manufacture according to this example preferably is similar to that of the first example illustrated in FIGS. 4A to 4G.

Fourth Example

Figure 10:
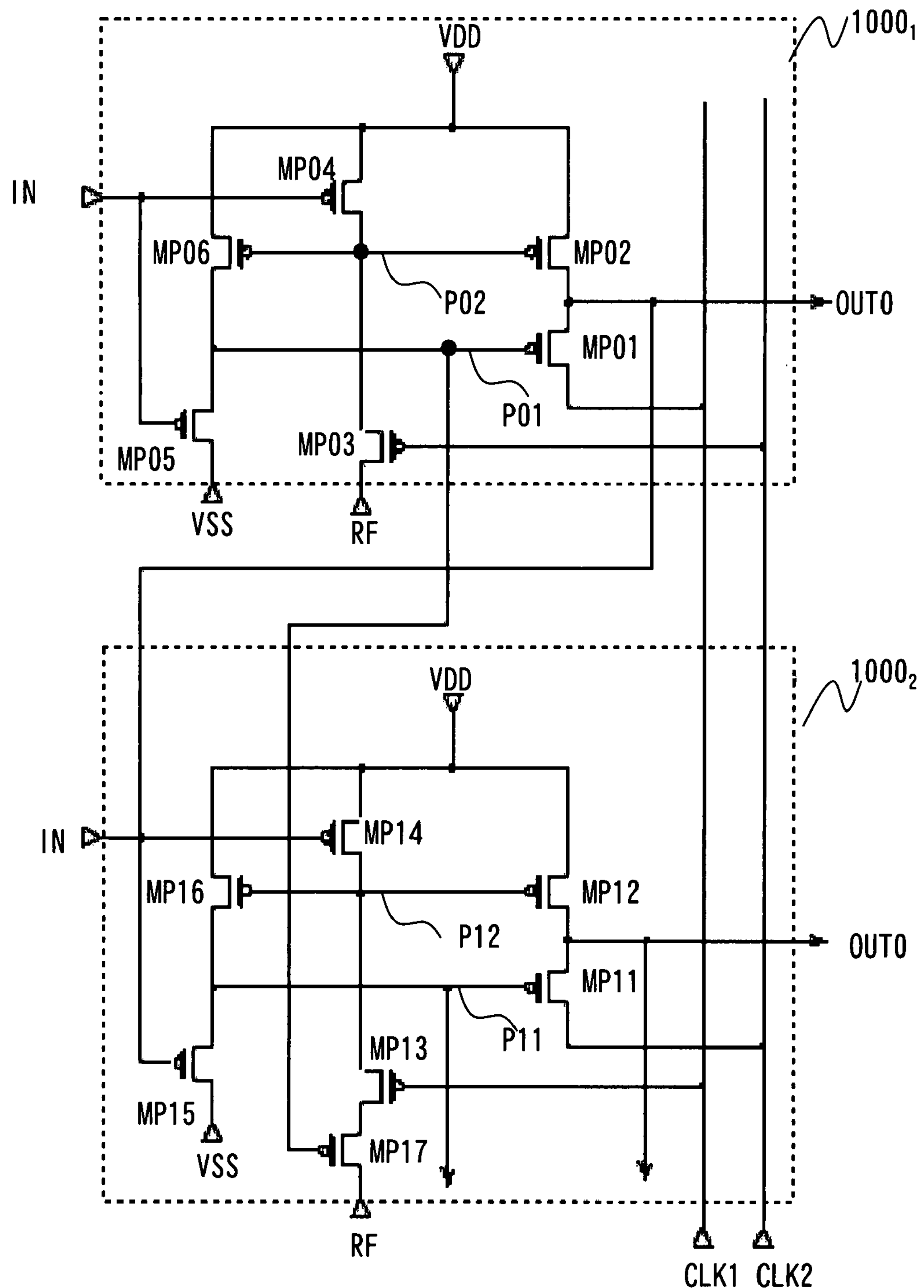
FIG. 10 is a diagram illustrating the arrangement of the fourth example.

The configuration of a fourth example of the present invention will be described next. FIG. 10 is a diagram illustrating the arrangement of the fourth example. As illustrated in FIG. 10, this example is such that the shift register $\mathbf{1000}_1$, which is the basic structural unit, is composed of PMOS transistors (MP01 to MP07). FIG. 10 illustrates an arrangement in which two of the shift registers 1000 are connected together to form two stages. The structure of the shift register $\mathbf{1000}_1$ of the first stage is the same as the configuration shown in FIG. 5. Stages from the second shift register $\mathbf{1000}_2$ onward have a structure different from the configuration shown in FIG. 5. The structural difference between the shift registers from the second shift register $\mathbf{1000}_2$ onward and the first shift register $\mathbf{1000}_1$ is the portion having transistors MP13 and MP17.

In the shift register $\mathbf{1000}_1$ of the first stage, a transistor MP03 controlled using the refresh signal RF and clock signal CLK2 is connected to a node P02. In the shift registers from the second shift register $\mathbf{1000}_2$ onward, however, the transistors MP17 and MP13 are cascade-connected between the RF terminal and node P12. Node P01 of the shift register $\mathbf{1000}_1$ of the first stage is connected to the gate of PMOS transistor MP17, and the clock signal CLK1 is connected to the gate of PMOS transistor MP13.

Further, it is preferred that the physical shape and size of each PMOS transistor be designed within limits in which circuit operation is possible with a sufficient operating margin. The OUT signal is output by inputting clock signals CLK1 and CLK2, start signal ST and refresh signal RF as control signals.

Figure 11:
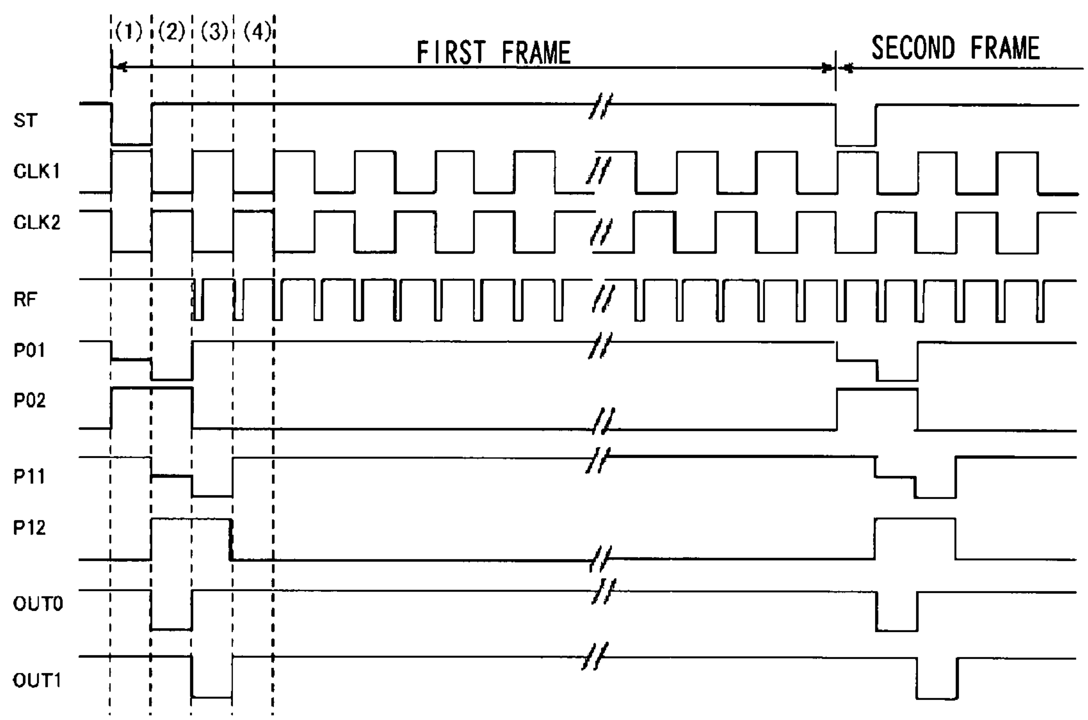
FIG. 11 is a timing chart useful in describing the operation of the fourth example.

FIG. 11 is a timing chart for describing the operation of this example. The operation of this example will be described with reference to FIGS. 10 and 11.

One of features of this example is that the refresh signal RF is fixed at a high level in the period over which the shift register $1000_1$ of the first stage is activated [namely through period (2) in FIG. 11].

When the start signal ST at a low level is supplied to the shift register $1000_1$ of the first stage [(1) in FIG. 11], transistors MP04 and MP05 are both turned on. As a result, node P01 is set to (VSS+VT) by transistor MP05 and node P02 is set to VDD by transistor MP04. Here VT represents the threshold value voltage of the transistors.

Next, when the start signal ST transitions to a high level and the clock signal CLK1 transitions to a low level [(2) in FIG. 11], the node P01 falls further from the potential (VSS+VT) owing to the bootstrap effect. As a result, the voltage applied to the gate of transistor MP01 rises and the output OUT0 undergoes a transition to VSS. Furthermore, when the clock signal CLK1 transitions to a high level and the clock signal CLK2 transitions to a low level [(3) in FIG. 11), a high level of the clock signal CLK1 is transferred to the output terminal OUT, whereby the output OUT0 undergoes a transition to the high level. Further, since the refresh signal RF again transitions to a low level, the node P02 transitions from high to low [(3) in FIG. 11].

Next, the operation of the shift register $1000_2$ of the second stage will be described. The output OUT0 of the shift register $1000_1$ of the preceding stage, i.e., the first stage, is connected to the gates of transistors MP14, MP15 in the shift register $1000_2$ of the second stage. At (2) in FIG. 11, therefore, the operation of the shift register $1000_2$ of the second stage starts at the moment the signal OUT0 transitions to a low level.

That is, the transistors MP14 and MP15 both turn on, node P11 is set to a potential (VSS+VT) by transistor MP15 and node P12 is set to VSS by transistor MP14.

Next, when OUT0 transitions to a high level and the clock signal CLK2 transitions to a low level [(3) in FIG. 11], node P11 falls further from the potential (VSS+VT) owing to the bootstrap effect. As a result, the voltage applied to the gate of transistor MP1 falls and the output OUT1 of the shift register $1000_2$ of the second stage undergoes a transition to VSS. Furthermore, when the clock signal CLK2 transitions to a high level and the clock signal CLK1 transitions to a low level, a high level of the clock signal CLK2 is transferred to the output terminal OUT1, whereby the output OUT1 of the shift register $1000_2$ of the second stage undergoes a transition to a high level [(4) in FIG. 11). The signal OUT1 of the shift register $1000_2$ of the second stage is transferred to the shift register 1000 of a third stage, which is not shown.

Each of the thus cascade-connected shift registers 1000 starts operating upon receiving the OUT signal from the adjacent shift register 1000, whereby the OUT signal is output and transferred successively from stage to stage.

According to one of features of the present invention, a node that is set into the floating state can be set to any potential once per one clock period by using the refresh signal RF. Since the duration of the floating state is shortened, circuit malfunction due to fluctuations in transistor characteristics can be suppressed.

Further, the refresh signal RF is fixed at a high level in the period over which the shift register $1000_1$ of the first stage is activated. Therefore, even in a case where the transistors MP03 and MP04 in FIG. 10 attain an ON state simultaneously owing to the second clock signal CLK2 and start signal ST, respectively, so that a conductive state is attained between VDD and RF, VDD and RF will be at the same potential and, hence, a short-circuit current will not be produced. In this example, therefore, it is possible to realize a shift register that consumes little power.

The method of manufacture according to this example preferably is similar to that of the second example illustrated in FIGS. 7A to 7G.

Fifth Example

Figure 12:
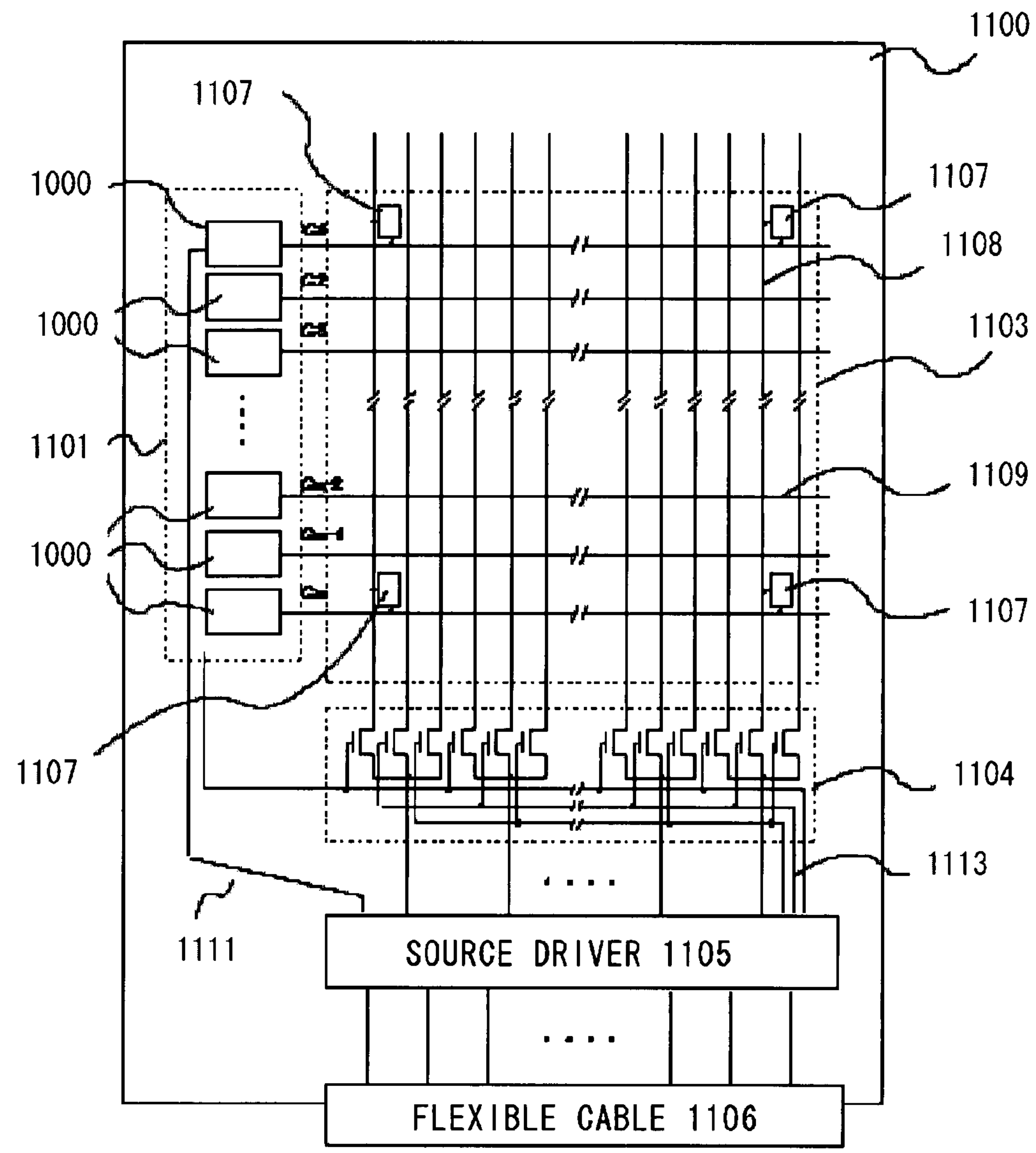
FIG. 12 is a diagram illustrating the arrangement of a fifth example of the present invention.

FIG. 12 is a diagram illustrating the arrangement of the fifth example of the present invention. This example is an example in which the semiconductor circuit according to any one of the first to fourth examples is applied as the scan circuit of a display device.

Referring to FIG. 12, a display panel includes a transistor substrate 1100, on which there are provided:

a pixel array 1103;

a scan circuit (also termed gate-line driving circuit or gate driver) 1101 which sequentially activates gate lines 1109;

a source driver (also termed data-line driving circuit or data driver) 1105 which drives data lines with gray-scale voltages corresponding to video data signals;

a switch circuit 104 which performs on/off control of the connection between the output of the source deriver 1105 and respective RGB data lines 1108; and a flexible cable 1106 which has one end connected to the source driver 1105 and other end connected to an externally connected device not shown.

Figure 17:
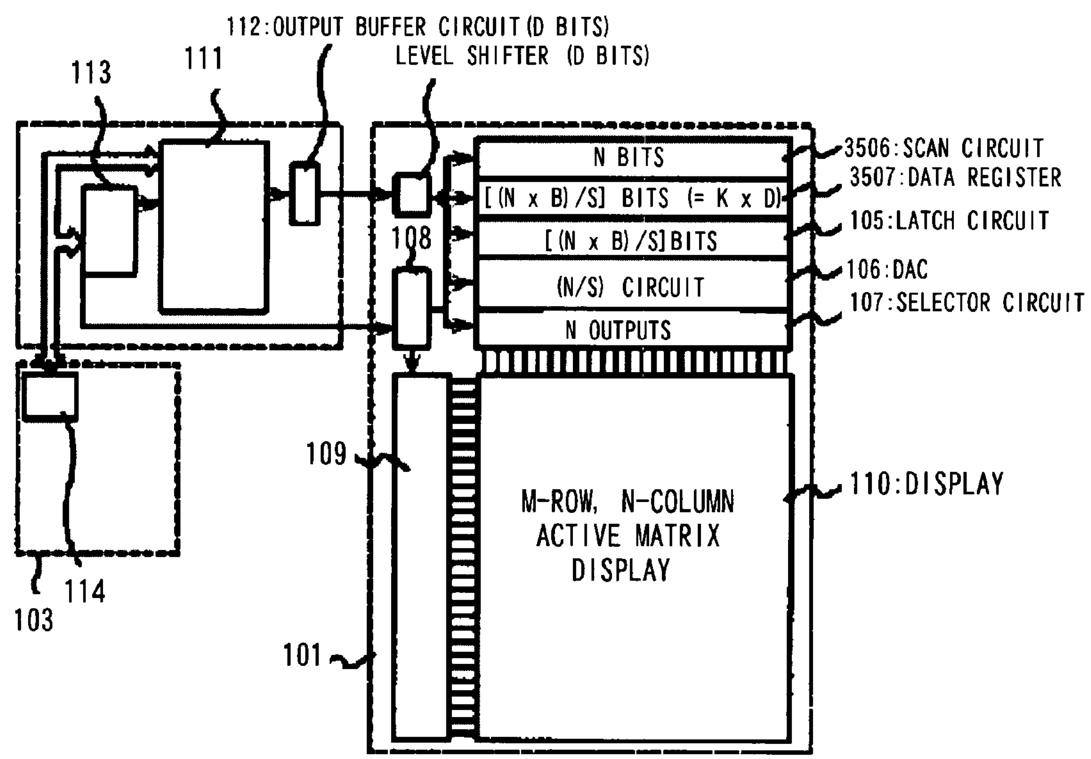
FIG. 17 is a diagram illustrating the configuration of the display system of a liquid crystal display device having a built-in DAC according to the prior art.
Figure 18:
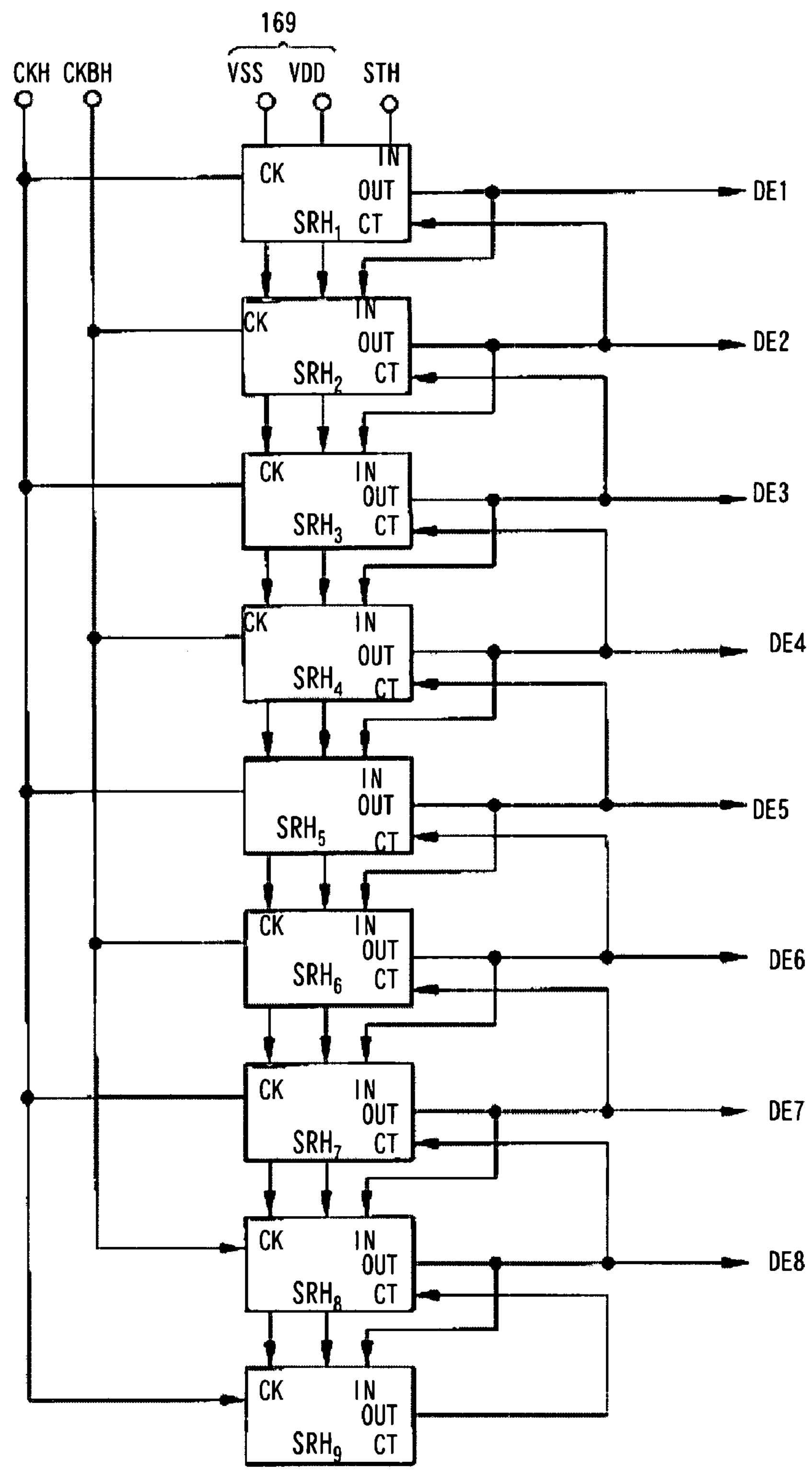
FIG. 18 is a diagram illustrating the configuration of a shift register described in Patent Document 2 (Japanese Patent Kokai Publication No. JP2004-78172A)
Figure 19:
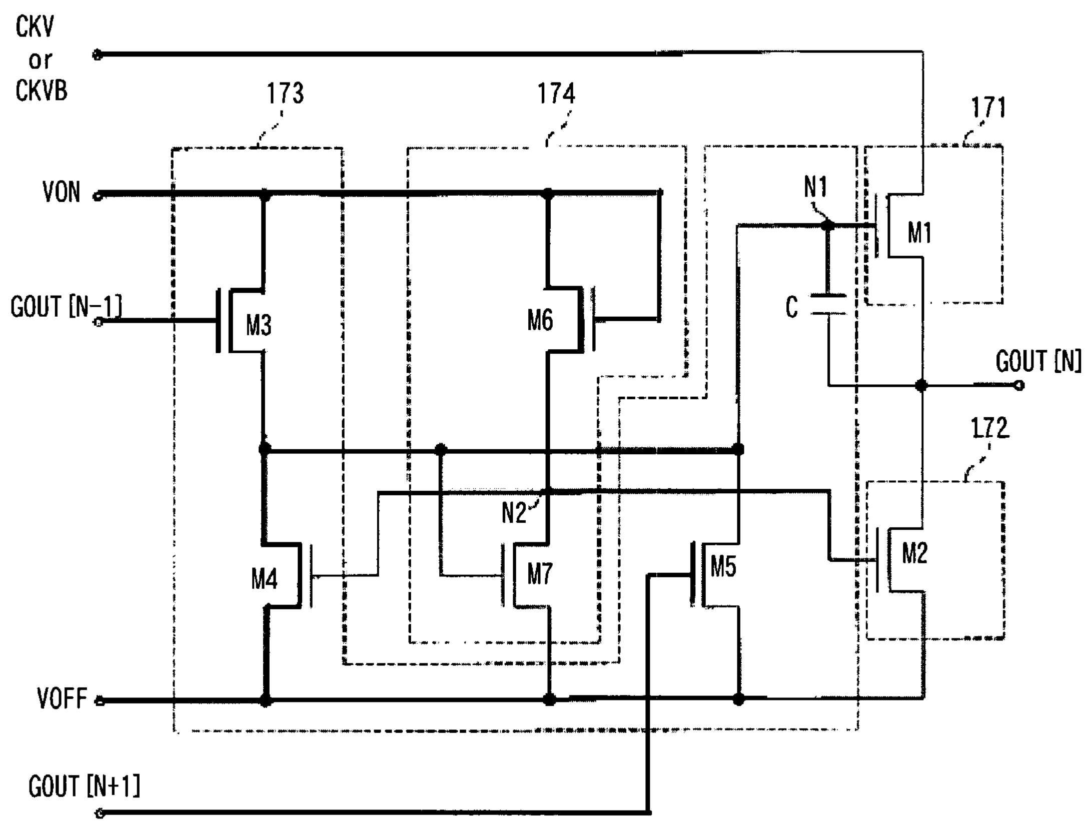
FIG. 19 is a diagram illustrating the configuration of a shift register described in Patent Document 2 (Japanese Patent Kokai Publication No. JP2004-78172A)
Figure 20:
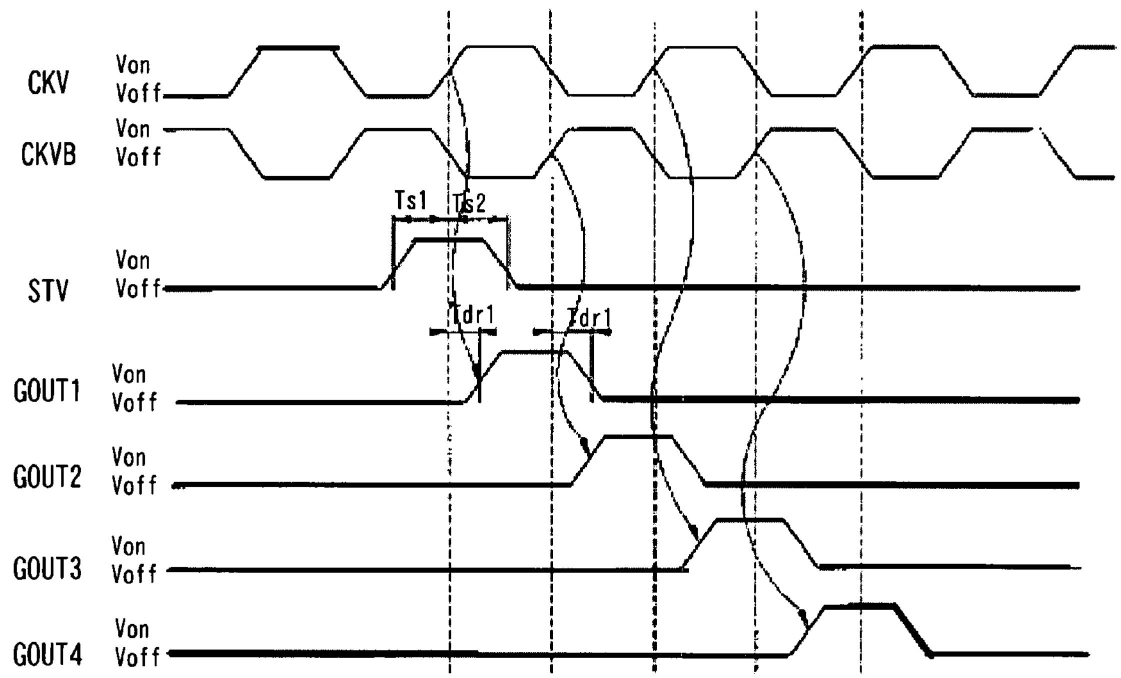
FIG. 20 is an output waveform diagram of the shift register of Patent Document 2 (Japanese Patent Kokai Publication No. JP2004-78172A)
Figure 21:
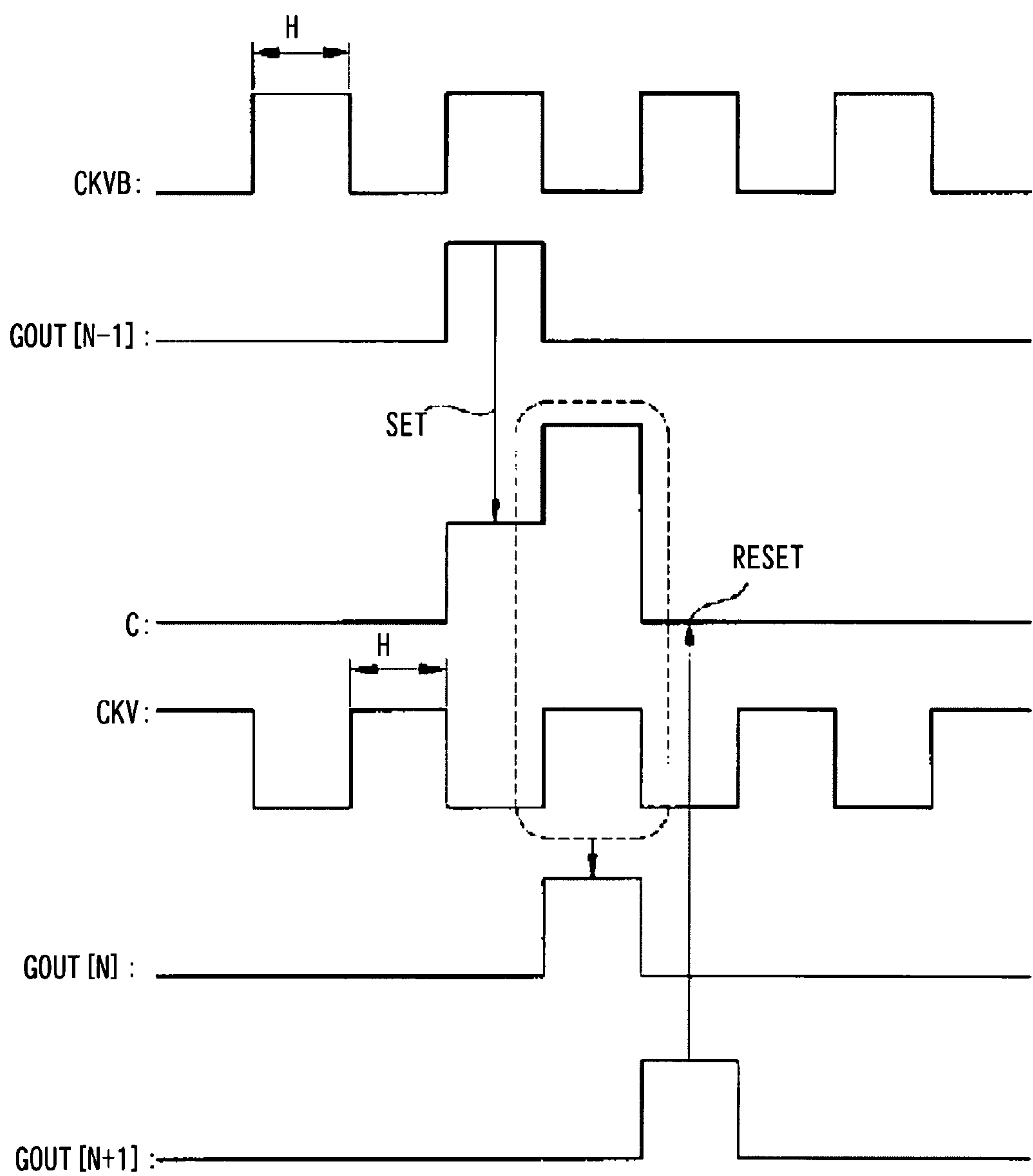
FIG. 21 is a waveform diagram useful in describing driving waveforms based upon the shift register of Patent Document 2 (Japanese Patent Kokai Publication No. JP2004-78172A)
Figure 22:
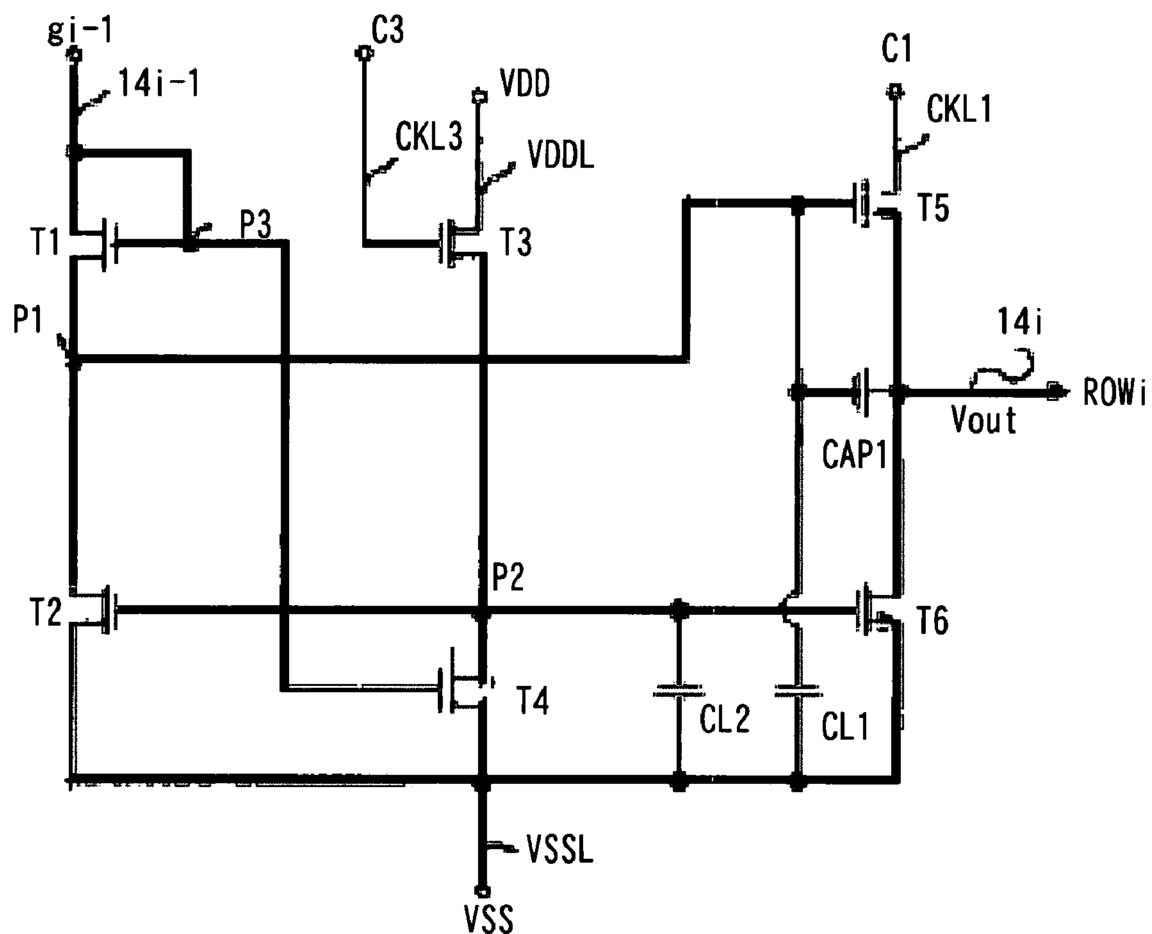
FIG. 22 is a diagram illustrating a shift register circuit described in Patent Document 3 (Japanese Patent Kokai Publication No. JP2000-155550A)
Figure 23:
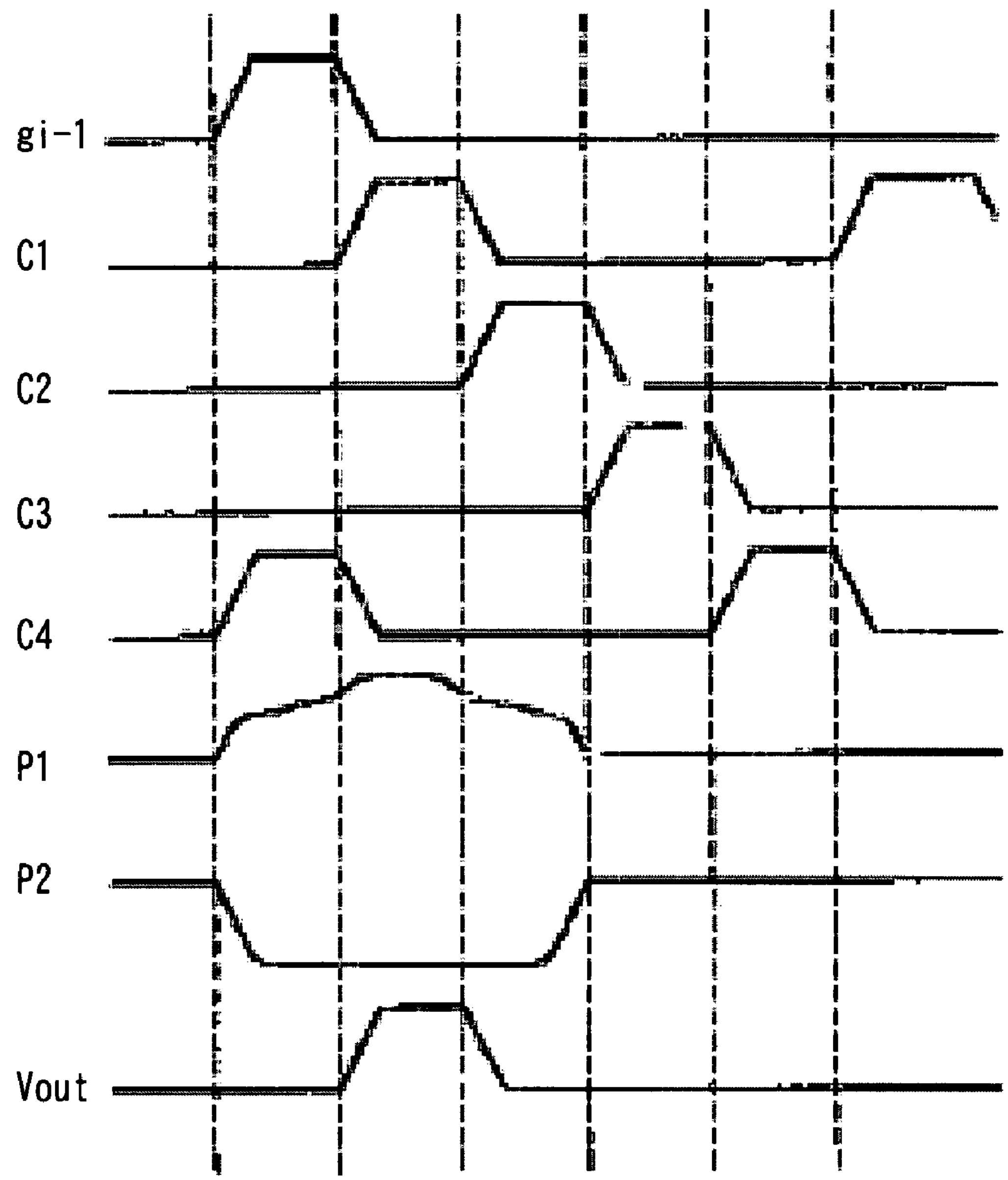
FIG. 23 is an input/output waveform diagram of the shift register described in Patent Document 3 (Japanese Patent Kokai Publication No. JP2000-155550A).

The externally connected device connected to the flexible cable 1106 may be such a display controller IC as described with reference to FIG. 17. Alternatively, the externally connected device connected to the flexible cable 1106 may be a MPU which performs data processing and also provides video data and control and timing signals to the display panel.

The scan circuit 1101 may be formed of transistors which are fabricated using the same process as transistors (pixel switch) constituting the pixel array 1103.

The source driver 1105 may be formed of transistors which are fabricated using the same process as transistors (pixel switch) constituting the pixel array 1103 or may be formed of an IC chip including transistors formed on a mono-crystalline silicon substrate.

The display panel as described below includes the transistor substrate 1100 and an opposing insulating substrate not shown with optical elements provided therebetween.

The transistor substrate 1100 preferably comprises a light-permeable insulating substrate. The pixel array 1103 has a plurality of pixels 1107. The pixels 1107 may be liquid crystal optical elements, organic EL elements or other elements, the optical characteristic of which changes responsive to a control signal.

The pixels 1107 are arranged at the intersection points of data lines 1108 and gate lines 1109. Pixels 1107 which are connected in common to a gate line 1109 are activated in unison by a control signal (scan signal) that is supplied to the gate line 1109, and the activated pixels 1107 each indicate an optical characteristic that corresponds to signals transferred from the data lines 1108.

The switch circuit 1104 includes transistors arrayed in parallel. Either the source or drain electrode of each transistor is connected to an associated data line 1108. The gate signal and the other of the source or drain of the transistor in the switch circuit 1104 are connected to wirings from the source driver 1105, respectively. When the transistor in the switch circuit 1104 turns on, the data line connected to the transistor is driven to a potential corresponding to video data by the source driver 1105.

Among switch signals (R, G, B) 1113 output from the source driver 1105 are connected to gates of transistors in the switch circuit 1104, the source or drain electrodes of which are connected to R, G, B data lines, respectively. The switch signal (R, G, B) 1113 are sequentially set to a high level in time division manner in one line period and the associated transistors in the switch circuit 1104 are sequentially set in an ON state. At least one of switch signals (R, G, B) 1113 is connected to shift register 1000 in addition to the switch circuit 1104.

In the example shown in FIG. 12, which does not represent any particular limitation, the signal line of a switch signal (R) is routed to the shift register 1000. The switch signal (R) is supplied as the refresh signal RF to the shift register 1000 according to any one of the above described first to fourth examples. In this example, since the switch signal (R) which is for on/off controlling the transistors in the switch circuit 1104 serves also as the refresh signal RF supplied to the shift register 1000, there is no need for the source driver 1105 to provide a dedicated control signal for the refresh signal RF anew. As a result, any existing or off-the-shelf source driver may be used as the source driver 1105.

The scan circuit 1101 includes a plurality of the shift registers 1000 connected in cascade.

As described above, the shift register 1000 in this example corresponds to the shift register 1000 according to any one of the first to fourth examples.

Clock signal lines (CLK1, CLK2) and switch signal line (R) extend from the source driver 1105 and are electrically connected to the scan circuit 1101. Output signals from the shift registers 1000 are connected to respective ones of gate lines (G1, G2, . . . , Gn). As mentioned above, the switch signal (R) corresponds to the refresh signal RF that controls each of the shift registers 1000. The start signal (ST) 1111 from the source driver 1105 is supplied to the input terminal IN of the shift register 1000. The clock signals (CLK1, CLK2) from the source driver 1105 are connected to the clock input terminals (C1, C2) of the shift register 1000 in the manner as shown in FIG. 2, FIG. 8 or FIG. 10.

The flexible cable 1106 is connecting means for supplying the source driver 1105 with electric signals from an externally connected device (not shown). Further, the source driver 1105 receives electric signals from the externally connected device, these signals being transferred via the flexible cable 1106. The source driver 1105 transfers the electric signals to the scan circuit 1101 and switch circuit 1104. In this example, the externally connected device may provides video data and timing and control signals (for example, clock, start signal ST and/or switch signals R, G, B) via the flexible cable 1106 to the source driver 1105. Alternately, the source driver 1105 may generate the timing and control signals (for example, clock, start signal ST and/or switch signals R, G, B).

Although the transistor substrate 1100 is illustrated in FIG. 12, an actual display device has a structure in which optical elements are sandwiched between the transistor substrate 1100 and a separate opposing substrate (not shown). More specifically, the opposing substrate may be formed of a light-permeable insulating-substrate having a light-permeable-electrode opposed to the pixel array 1103 on the transistor substrate 1100, with optical elements sandwiched between the two insulating-substrates.

The shift register 1000 constituting the scan circuit 1101 of this example has the configuration according to any of the first to fourth examples described above. With regard to the operation of the shift register 1000 itself, therefore, there is no difference from the method of operation set forth in each of the examples.

The start signal (ST) and clock signals (CLK1 to CLK4) are supplied to the scan circuit 1101, pulses are applied to the gate lines 1109 (G1, G2, G3, . . . , G4, Gn-2, Gn-1, Gn), and pixels 1107 connected to the gate lines 1109 are selected and activated. The waveforms on lines G1 to Gn at this time correspond to the OUT signals of the shift registers 1000 of any of the first to fourth examples.

Figure 13A:
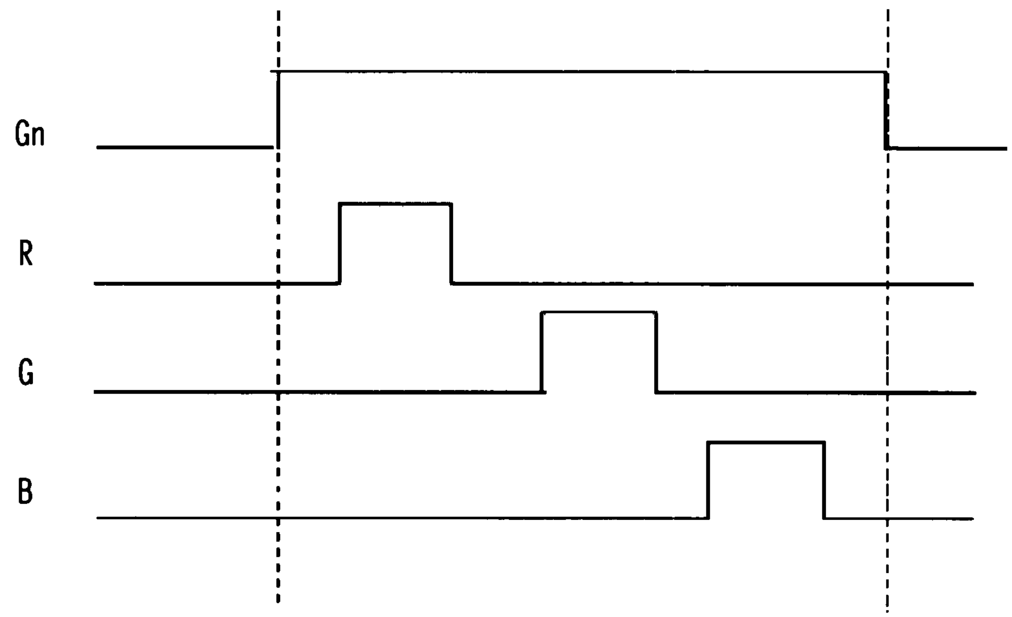
FIGS. 13A and 13B are timing charts useful in describing the operation of the fifth example.
Figure 13B:
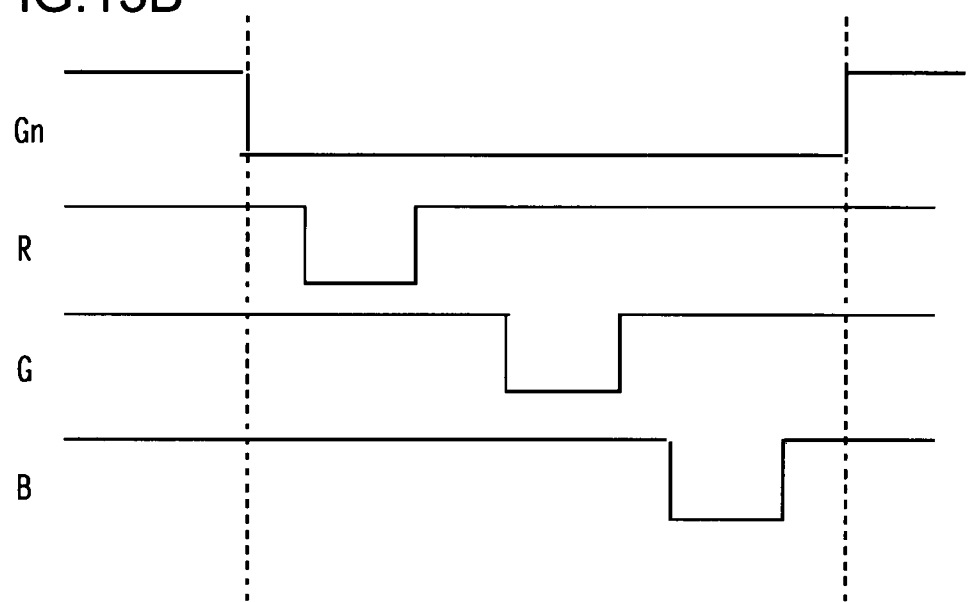

Timing charts using the Gn pulse as a reference are illustrated in FIGS. 13A and 13B, respectively. FIG. 13A corresponds to the circuit comprising the NMOS transistors described in the first or third example, and FIG. 13B corresponds to the circuit comprising the PMOS transistors described in the second or fourth example.

Operation will be described with reference to FIG. 13A. FIG. 13A illustrates a pulse applied to the gate line Gn of any nth stage and a change in the potentials of the switch signals (R, G, B).

When the gate line Gn of any nth stage undergoes a transition from the low to the high level, the switch signals R, G, B undergo a transition from the low to a high level one after another. A video signal that has been output from the source driver 1105 is set on the data line 1108 connected to each switch.

After the switch signal B transitions completely to a low level, Gn transitions to a low level, thereby completing one series of operations.

The method of manufacturing this example differs depending upon the configuration of the shift register 1000 used. For example, in the case of the shift register 1000 described in the first or third example, the manufacturing method described in FIGS. 4A to 4G is used. Further, in the case of the shift register 1000 described in the second or fourth example, the manufacturing method described in FIGS. 7A to 7G is used.

With regard also to the transistors that construct the other circuits, e.g., the switch circuit 1104, source driver 1105 and pixels 1107, it is desired that fabrication be performed through a process identical with that used for the transistors that construct the shift register 1000.

Sixth Example

Figure 14:
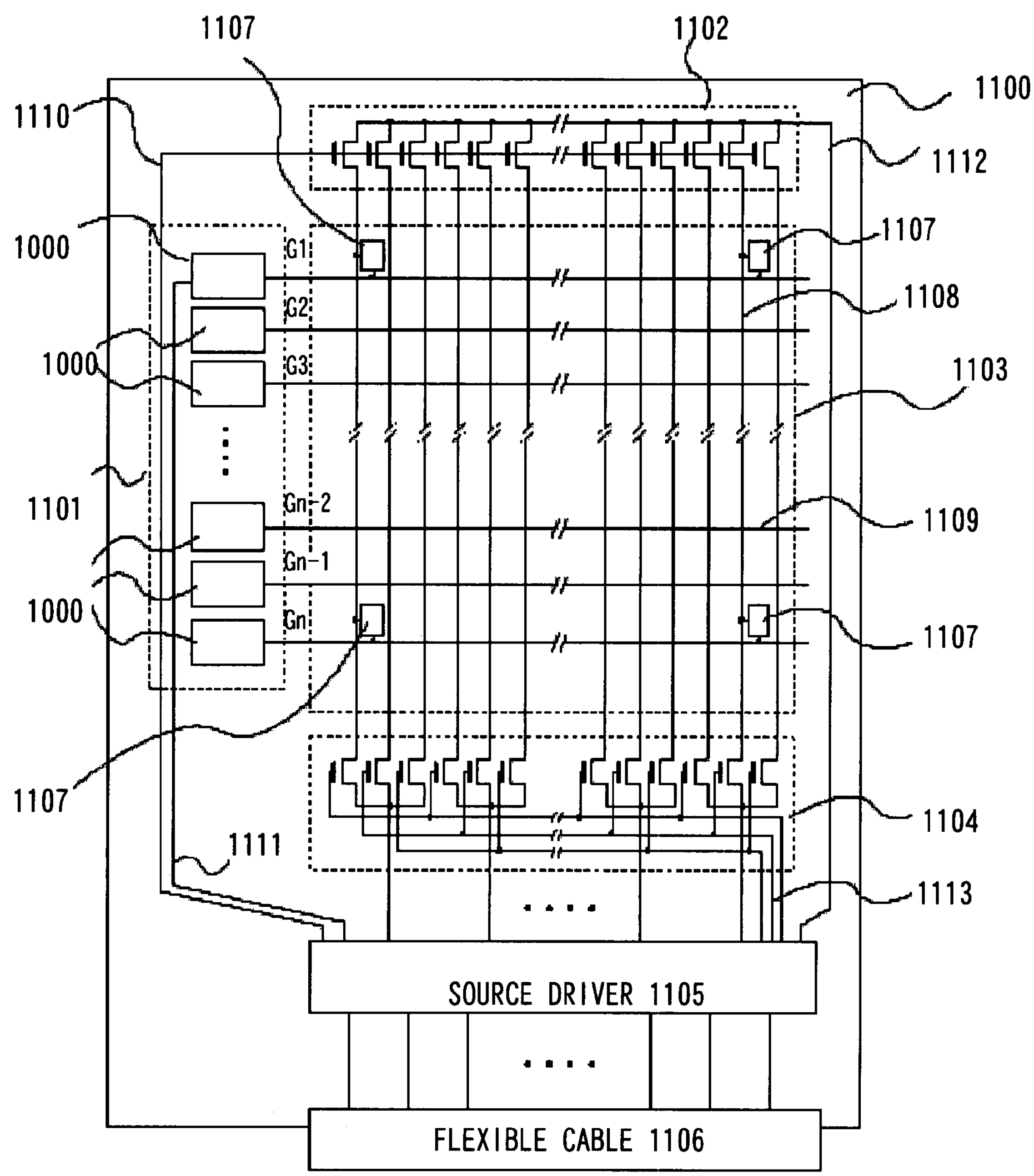
FIG. 14 is a diagram illustrating the arrangement of a sixth example of the present invention.

FIG. 14 is a diagram illustrating the arrangement of a sixth example of the present invention. In this example, the semiconductor circuit according to any one of the first to fourth examples is applied as the scan circuit of a display device. Referring to FIG. 14, this example differs from the example shown in FIG. 12 in that a precharge circuit 1102 for precharging data lines 1108 is further provided and that as the refresh signal RF supplied to the shift resister 1000 according to any one of the first to fourth examples, a precharging signal (PC) which is supplied from the source driver 1105 to control the activation/deactivation of the precharge circuit 1102 is used, in place of the switch signal (R) in FIG. 12.

As shown in FIG. 14, in this example, a display panel includes a transistor substrate 1100, on which there are provided a the pixel array 1103, a precharging circuit 1102, the switch circuit 1104, the scan circuit 1101, the source driver 1105 and the flexible cable 1106 on the transistor substrate 1100. The transistor substrate 1100 preferably comprises a light-permeable insulating substrate. The pixel array 1103 has a plurality of pixels 1107 in the form of an array. The pixels 1107 may be ordinary liquid crystal optical elements, organic EL elements or other elements the optical characteristics of which change upon receiving a control signal.

The pixels 1107 are placed at the cross points of data lines 1108 and gate lines 1109. Pixel 1107 is activated by a control signal that passes through gate line 1109, and the pixel indicates an optical characteristic that conforms to a signal transferred from the data line 1108.

The switch circuit 1104 and the precharging circuit 1102 include transistors arrayed in parallel.

Either the source or drain electrode of each transistor is connected to data line 1108. When the transistor turns on, the data line can be set to any potential. The gate signal and the other of the source or drain of the transistor are electrically connected to wiring (switch signal lines) that extend from the source driver 1105.

A precharging signal (PC) 1110 is connected via the scan circuit 1101 to the gates of the transistors constituting the precharging circuit 1102.

In this example, since the precharging signal 1110 controlling the precharge circuit 1102 is used in common as the refresh signal RF supplied to the shift register 1000 in the scan circuit 1101, there is no need for the source driver 1105 to provide a dedicated control signal for the refresh signal RF anew.

The scan circuit 1101 has the plurality of shift registers 1000 in the cascade arrangement.

The shift register 1000 corresponds to the shift register 1000 according to any one of the first to fourth examples.

Clock signal lines (CLK1, CLK2), start signal line (ST) and precharging signal line (PC) are routed from the source driver 1105 and are electrically connected to the scan circuit 1101. Output signals from the shift registers 1000 are connected to respective ones of gate lines (G1, G2, . . . , Gn).

The flexible cable 1106 is connecting means for supplying the source driver 1105 with electric signals from an externally connected device (not shown).

Further, the source driver 1105 receives electric signals from the externally connected device, these signals being transferred via the flexible cable 1106. The source driver 1105 transfers the electric signals to the scan circuit 1101, switch circuit 1104 and precharging circuit 1102.

Although the transistor substrate 1100 is illustrated in FIG. 14, a display device has a structure in which optical elements are sandwiched between the transistor substrate 1100 and a separate opposing substrate (not shown).

The shift register 1000 constituting the scan circuit 1101 of this example has the configuration according to any of the first to fourth examples described above. With regard to the operation of the shift register 1000 itself, therefore, there is no difference from the method of operation set forth in each of the examples.

The start signal (ST) and clock signals (CLK1 to CLK4) are input to the scan circuit 1101, pulses are applied to the gate lines 1109 (G1, G2, G3, . . . , G4, Gn-2, Gn-1, Gn), and pixels 1107 connected to the gate lines 1109 are selected and activated. The waveforms on lines G1 to Gn at this time correspond to the OUT signals of the shift registers 1000 of any of the first to fourth examples.

Figure 15A:
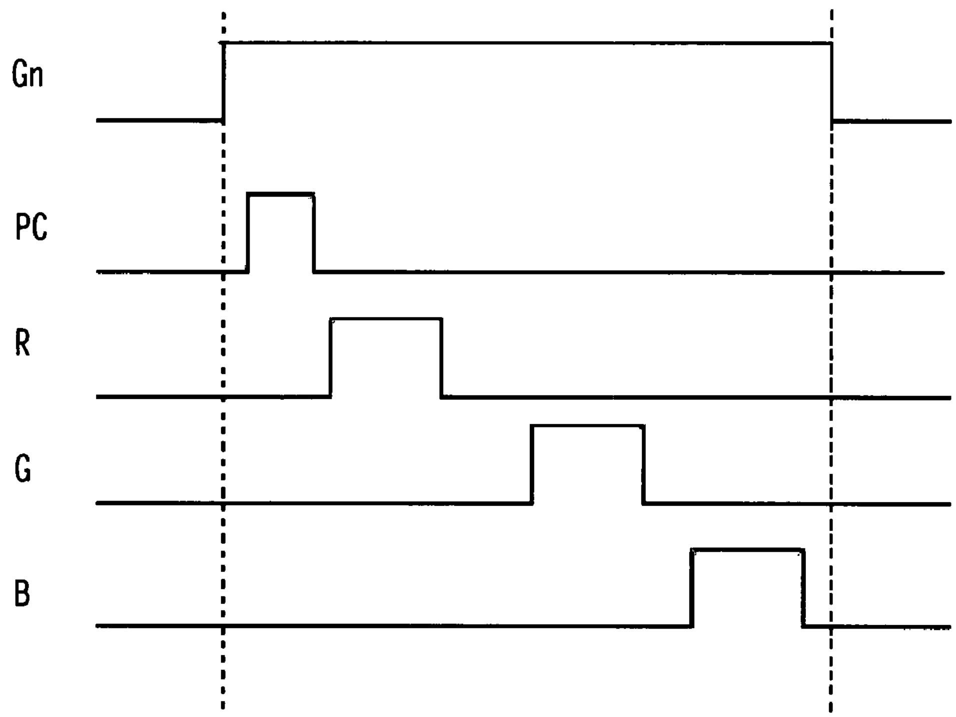
FIGS. 15A and 15B are timing charts useful in describing the operation of the sixth example.
Figure 15B:
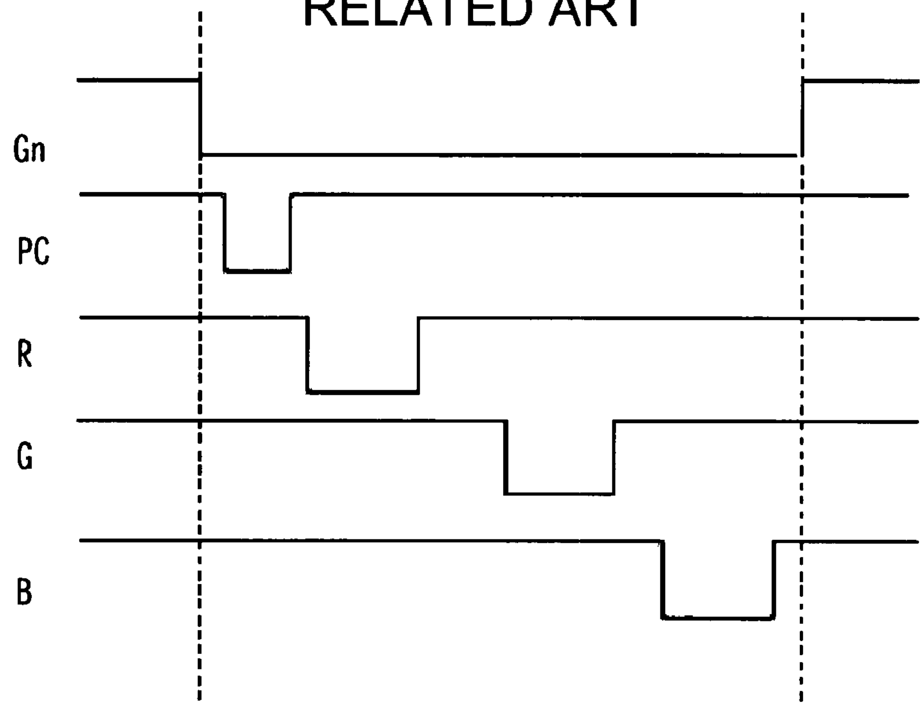
Figure 16:
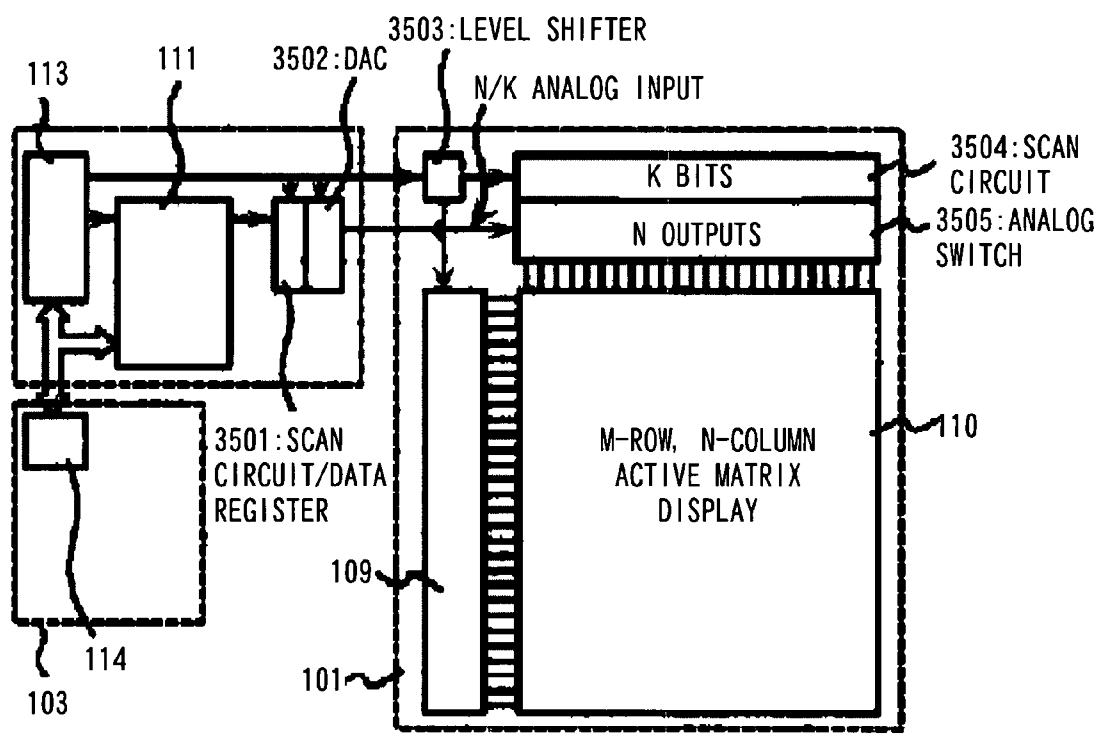
FIG. 16 is a block diagram illustrating the configuration of the display system of a liquid crystal display device integrated with a driver circuit according to the prior art.

Timing charts using the Gn pulse as a reference are illustrated in FIGS. 15A and 15B, respectively. FIG. 15A corresponds to the circuit comprising the NMOS transistors described in the first or third example, and FIG. 15B corresponds to the circuit comprising the PMOS transistors described in the second or fourth example.

Operation will be described with reference to FIG. 15A. FIG. 15A illustrates a pulse applied to the gate line Gn of any nth stage and a change in the potentials of the precharging signal (PC) and switch signals (R, G, B). When the gate line Gn undergoes a transition from the low to the high level, the precharging signal (PC) transitions from the low to a high level upon elapse of a prescribed period of time.

As a result, the precharging circuit 1102 is activated and all of the transistors constituting the precharging circuit 1102 attain an ON state at one time. The potentials of the data lines 1108 are thus set to the voltage value of the precharging power supply.

Next, the switch signals R, G, B undergo a transition from the low to a high level one after another. A video signal that has been output from the source driver 1105 is set on the data line 1108 connected to each switch. After the switch signal B transitions completely to a low level, the gate line Gn transitions to a low level, thereby completing one series of operations.

The method of manufacturing this example differs depending upon the configuration of the shift register 1000 used. For example, in the case of the shift register 1000 described in the first or third example, it is preferred that the manufacturing method described in FIGS. 4A to 4G be used. Further, in the case of the shift register 1000 described in the second or fourth example, it is preferred that the manufacturing method described in FIGS. 7A to 7G be used.

With regard also to the transistors that construct the other circuits, e.g., the switch circuit 1104, source driver 1105 precharging circuit 1102 and pixels 1107, it is preferred that fabrication be performed through a process identical with that used for the transistors that construct the shift register 1000.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor circuit comprising:

first and second shift registers, wherein said first shift register includes:

a signal input terminal for receiving an input signal;

an output terminal for outputting an output signal;

first and second clock terminals for receiving first and second clock signals, respectively;

a refresh terminal for receiving a refresh signal;

first and second power supply terminals connected to first and second power supplies, respectively;

first and second transistors connected between the first clock terminal and the first power supply terminal;

third and fourth transistors connected between the refresh terminal and the first power supply terminal; and fifth and sixth transistors connected between the second power supply and the first power supply terminal;

said fourth and fifth transistors have respective control terminals connected in common to the signal input terminal of said first shift register;

said third transistor has a control terminal connected to the second clock terminal;

said first transistor has a control terminal connected to a node at which said fifth and sixth transistors are connected;

said second transistor has a control terminal connected to a control terminal of said sixth transistor; and a node at which said first and second transistors are connected is connected to the output terminal of said first shift register; and said second shift register includes:

a signal input terminal for receiving an input signal;

an output terminal for outputting an output signal;

first and second clock terminals for receiving the first and second clock signals, respectively;

a refresh terminal for receiving the refresh signal;

first and second power supply terminals connected to the first and second power supplies of said second shift register, respectively;

seventh and eighth transistors connected between the second clock terminal and the first power supply terminal of said second shift register;

ninth, tenth and eleventh transistors connected between the refresh terminal and the first power supply terminal of said second shift register; and twelfth and thirteenth transistors connected between the second power supply terminal and the first power supply terminal of said second shift register;

said eleventh and twelfth transistors have respective control terminals connected in common to the input terminal of said second shift register which is connected to the output terminal of said first shift register;

said ninth transistor has a control terminal connected to the control terminals of the second and sixth transistors;

said tenth transistor has a control terminal connected to the first clock terminal of said second shift register;

said seventh transistor has a control terminal connected to a node at which said twelfth and thirteenth transistors are connected;

said eighth transistor has a control terminal connected to a control terminal of said thirteenth transistor; and a node at which said seventh and eighth transistors are connected is connected to an output terminal of said second shift register; and wherein the refresh terminal and first and second clock terminals of said first and second shift registers are connected to a refresh signal line and first and second clock signal lines, respectively;

the first and second clock signals are complementary; and the period of the signal supplied to the refresh terminal is shorter than the period of the clock signals that are input to the first and second clock terminals.

2. The semiconductor circuit according to claim 1, wherein said first to thirteenth transistors comprise thin-film transistors.

3. A scan circuit having the semiconductor circuit as set forth in claim 1.

4. A display device having the scan circuit as set forth in claim 3.

* * * * *